United States Patent
Pal et al.

(10) Patent No.: US 10,266,951 B2
(45) Date of Patent: Apr. 23, 2019

(54) METHOD AND APPARATUS FOR PRODUCING SOLAR GRADE SILICON USING A SOM ELECTROLYSIS PROCESS

(71) Applicant: TRUSTEES OF BOSTON UNIVERSITY, Boston, MA (US)

(72) Inventors: Uday B. Pal, Dover, MA (US); Soumendra N. Basu, Westwood, MA (US); Yihong Jiang, Boston, MA (US); Jiapeng Xu, Boston, MA (US)

(73) Assignee: TRUSTEES OF BOSTON UNIVERSITY, Boston, MA (US)

( * ) Notice: Subject to any disclaimer, the term of this patent is extended or adjusted under 35 U.S.C. 154(b) by 0 days.

(21) Appl. No.: 14/353,008

(22) PCT Filed: Nov. 26, 2013

(86) PCT No.: PCT/US2013/072025
§ 371 (c)(1),
(2) Date: Apr. 18, 2014

(87) PCT Pub. No.: WO2014/085467
PCT Pub. Date: Jun. 5, 2014

(65) Prior Publication Data
US 2015/0259808 A1 Sep. 17, 2015

Related U.S. Application Data

(60) Provisional application No. 61/730,880, filed on Nov. 28, 2012.

(51) Int. Cl.
C25B 1/00 (2006.01)
C25B 9/08 (2006.01)
(Continued)

(52) U.S. Cl.
CPC ............. *C25B 1/006* (2013.01); *C25B 9/08* (2013.01); *C25B 13/04* (2013.01); *C25C 3/00* (2013.01);
(Continued)

(58) Field of Classification Search
CPC ..... C02F 2201/46155; C02F 2201/003; C25B 1/467; C25B 1/26; C25B 9/14; C25B 9/146; C25B 1/24
See application file for complete search history.

(56) References Cited

U.S. PATENT DOCUMENTS 4,256,717 A * 3/1981 Dawless ................. C01B 33/02
23/295 R
4,874,482 A * 10/1989 Honder et al. ............ C25B 1/00
205/354
(Continued)

FOREIGN PATENT DOCUMENTS

WO WO-2007/106860 A2 9/2007
WO WO-2007/112592 A1 10/2007
(Continued)

OTHER PUBLICATIONS

Alchagirov, B.B. and Chochaeva, A.M. "Temperature dependence of the density of liquid tin." Thermophysical Properties of Materials. High Temperature. Jan. 2000. vol. 38, Issue 1. pp. 48-52.*
(Continued)

*Primary Examiner* — Steven A. Friday
(74) *Attorney, Agent, or Firm* — Venable LLP; Henry J. Daley

(57) ABSTRACT

A method of manufacturing silicon via a solid oxide membrane electrolysis process, including providing a crucible, providing a flux including silica within the crucible, providing a cathode in the crucible in electrical contact with the flux, and providing an anode disposed in the crucible spaced
(Continued)

apart from the cathode and in electrical contact with the flux. The cathode includes a silicon-absorbing portion in fluid communication with the flux. The anode includes a solid oxide membrane around at least a portion of the anode. The method also includes generating an electrical potential between the cathode and anode sufficient to reduce silicon at an operating temperature, and cooling the silicon-absorbing portion to below the operating temperature, and precipitating out the silicon from the silicon-absorbing portion. The silicon-absorbing portion preferentially absorbs silicon, the silicon-absorbing portion is a liquid metal at the operating temperature, and the solid oxide membrane is permeable to oxygen.

28 Claims, 29 Drawing Sheets

(51) Int. Cl.
    C25B 13/04         (2006.01)
    C25C 7/00          (2006.01)
    H01L 31/18         (2006.01)
    C25C 3/00          (2006.01)
(52) U.S. Cl.
    CPC ............ *C25C 7/005* (2013.01); *H01L 31/182* (2013.01); *Y02E 10/546* (2013.01); *Y02P 70/521* (2015.11)

(56) References Cited

U.S. PATENT DOCUMENTS

| | | | | |
|---|---|---|---|---|
| 5,279,715 | A * | 1/1994 | La Camera | C25C 3/04 204/247.4 |
| 2006/0185984 | A1 | 8/2006 | Nguyen et al. | |
| 2007/0215483 | A1 | 9/2007 | Johansen et al. | |
| 2009/0000955 | A1* | 1/2009 | Pal | C25C 3/00 205/371 |
| 2009/0050483 | A1 | 2/2009 | Li | |
| 2010/0059118 | A1* | 3/2010 | Saegusa et al. | C01B 33/023 136/261 |
| 2010/0276297 | A1 | 11/2010 | Powell, IV et al. | |
| 2011/0079517 | A1* | 4/2011 | Powell, IV | C25C 3/04 205/404 |
| 2011/0302963 | A1 | 12/2011 | Tathgar | |
| 2012/0132034 | A1* | 5/2012 | Saegusa et al. | C01B 33/037 75/392 |
| 2013/0277227 | A1* | 10/2013 | Lau | C01B 33/021 205/358 |

FOREIGN PATENT DOCUMENTS

| | | | |
|---|---|---|---|
| WO | WO-2008-110012 A1 | 9/2008 | |
| WO | WO 2010137555 A1 * | 12/2010 | ........... C01B 33/037 |

OTHER PUBLICATIONS

Elwell, D. "Electrowinning of silicon from solutions of silica in alkali metal/fluoride/alkaline earth fluoride eutectics." Solar Energy Materials. Aug. 1981. vol. 5, Issue 2. pp. 205-210.*

Olson, J.M. and Kibbler, A.E. "Electrowinning of silicon using a molten tin cathode." (Abstract No. 468) Presented at the 160th Meeting of the Electrochemical Society, Denver, Colorado, Oct. 1981. pp. 1130-1131.*

Olson, J.M. "Electrolytic deposition of silicon on a molten tin cathode." (Abstract No. 28) Presented at the 157th Meeting of the Electrochemical Society, St. Louis, Missouri, May 1980. pp. 74-75.*

Thomas, Sridevi M. "Study of Properties of Cryolite—Lithium Fluoride Melt containing Silica." Dec. 17, 2012. Thesis, University of Toronto.*

R. Pandey et al. Handbook of semiconductor electrodeposition. Apr. 1996. p. 197.*

International Search Report dated Mar. 13, 2014 for PCT/US2013/072025.

Appel et al., "Structural and electrical characterisation of silica-containing yttria-stabilised zirconia," *Journal of the European Ceramic Society*, vol. 19, pp. 847-851, 1999.

Appel et al., "Ageing behaviour of zirconia stabilised by yttria and manganese oxide," *Journal of Materials Science*, vol. 36, No. 18, pp. 4493-4501, 2001.

Chen et al., "Overcoming the effect of contaminant in solid oxide fuel cell (SOFC) electrolyte: spark plasma sintering (SPS) of 0.5wt.% silica-doped yttria-stabilized zirconia (YSZ)," *Materials Science and Engineering: A*, vol. 374, No. 1-2, pp. 64-71, Jun. 2004.

Chokshi, "Diffusion, diffusion creep and grain growth characteristics of nanocrystalline and fine-grained monoclinic, tetragonal and cubic zirconia," *Scripta Materialia*, 2003: 48(6) pp. 791-796.

Das, "Primary Magnesium Production Costs for Automotive Applications," *JOM* 60 (11) 63 (2008).

Geerlings et al., "Specification of Solar Grade Silicon: How Common Impurities Affect the Cell Efficiency of mc-Si Solar Cells," Eur. Photov. Solar Ener. Conf. Barcelona, Spain, Jun. 6-10, 2005.

Gibson et al., "Influence of yttria concentration upon electrical properties and susceptibility to ageing of yttria-stabilised zirconias," *Journal of the European Ceramic Society*, vol. 18, No. 6, pp. 661-667, Jan. 1998.

Gratz et al., "Determining Yttria Stabilized Zirconia (YSZ) Stability in Molten Oxy-Fluoride Flux for the Production of Magnesium with the SOM Process," *Journal of the American Ceramic Society*, 2013.

Gremillard et al., "Microstructural study of silica-doped zirconia ceramics," *Acta Materialia*, vol. 48, No. 18-19, pp. 4647-4652, Dec. 2000.

Hertz et al., "Highly enhanced electrochemical performance of silicon-free platinum-yttria stabilized zirconia interfaces," *Journal of Electroceramics*, vol. 22, No. 4, pp. 428-435, Apr. 2008.

Ikuhara et al., "Solute segregation at grain boundaries in superplastic SiO2-doped TZP," *Acta Materialia*, vol. 45, No. 12, pp. 5275-5284, Dec. 1997.

Jacobson, Review of solutions to global warming, air pollution and energy security, *Energy and Enviromental Science*, 2, pp. 148-173, (2009).

Jiang et al., "Solid Oxide Membrane Process for the Reduction of Uranium Oxide Surrogate in Spent Nuclear Fuel," *ECS Transactions*, 41 (33) 171-180 (2012).

Jung et al., "Liquid-phase redistribution during sintering of 8 mol% yttria-stabilized zirconia," *Journal of the European Ceramic Society*, vol. 23, No. 3, pp. 499-503, Mar. 2003.

Krishnan et al., "Solid oxide membrane process for magnesium production directly from magnesium oxide," *Metallurgical and Materials Transactions B*, vol. 36, No. Aug. 2005.

Krishnan et al., "Solid Oxide Membrane (SOM) technology for environmentally sound production of tantalum metal and alloys from their oxide sources," *Scandinavian journal of Metallurgy*, vol. 34, No. 5, pp. 293-301, 2005.

Martin et al., "Yttria-stabilized zirconia as membrane material for electrolytic deoxidation of CaO—CaCl2 melts," *Journal of Applied Electrochemistry*, vol. 40, No. 3, pp. 533-542, Oct. 2010.

McDanel Advanced Ceramic Technologies, "Zirconia," http://www.mcdanelceramics.com/pdf/mcdanel_zirconia.pdf, 2009.

Milshtein et al., "Yttria stabilized zirconia membrane stability in molten fluoride fluxes for low-carbon magnesium production by the SOM process," *Journal of Mining and Metallurgy*, Section B: Metallurgy, vol. 49, No. 2, pp. 183-190.

Mori et al., "Stability of Tetragonal Zirconia in Molten Fluoride Salts," *Journal of the Ceramic Society of Japan*, vol. 94, p. 961, 1986.

Morita et al., "Thermodynamic evaluation of new metallurgical refining processes for SOG-silicon production," *Transactions of Non-ferrous Metals Society of China*, 21, 685-690, (2011).

Pal et al., "The Use of Solid-oxide-membrane Technology for Electrometallurgy," *Journal of the Minerals, Metals and Materials Society*, 59 (5) (2007), 44-49.

(56) References Cited

OTHER PUBLICATIONS

Pal, "A Lower Carbon Foot Print Process for Production of Metals from their Oxide Sources," *JOM*, 60(2):36, 2008.

Pal et al., "Emerging SOM technology for the green synthesis of metals from oxides," *JOM*, vol. 53, No. 10, pp. 32-35, Oct. 2001.

Primdahl et al.s, "Microstructural examination of a superplastic yttria-stabilized zirconia: implications for the superplasticity mechanism," *Acta metallurgica et materialia*, vol. 43, No. 3, 1995.

Badwal and J. Drennan, "Grain boundary resistivity in Y-TZP materials as a function of thermal history," *Journal of Materials Science*, vol. 24, No. 1, pp. 88-96, Jan. 1989.

Badwal, "Yttria-zirconia: effect of microstructure on conductivity," *Journal of materials science*, vol. 22, pp. 3231-3239, 1987.

Jiang, J. Xu, X. Guan, U. B. Pal, and S. N. Basu, "Production of Silicon by Solid Oxide Membrane-Based Electrolysis Process," *MRS Proceedings*, vol. 1493, pp. MRSF12-1493-E19-89, Jan. 2013.

Minh, "Ceramic Fuel Cells," *Journal of the American Ceramic Society*, vol. 76, No. 3, pp. 563-588, Mar. 1993.

Reddy and A. S. Gandhi, "Molten salt attack on t' yttria-stabilised zirconia by dissolution and precipitation," *Journal of the European Ceramic Society*, vol. 33, No. 10, pp. 1867-1874, Sep. 2013.

Renewable Energy Policy Network for the 21st century (REN21), Renewables 2012 Global Status Report, Paris 2012, pp. 47.

Rohatgi, "Impurities in Silicon Solar Cells," IEEE Trans. Electron. Devices ED-27(4) Apr. 1980.

Stournaras, A. Tsetsekou, T. Zambetakis, C. G. Kontoyannis, and G. Carountzos, "Corrosion of yttria-fully stabilized zirconias in molten fluorides," Journal of Materials Science, vol. 30, No. 17, pp. 4375-4379, Sep. 1995.

Sugihara and K. Okazaki, "Wetting of silicon single crystal by silver and tin, and their interfaces," Journal of materials science, vol. 28, pp. 2455-2458, 1993.

Suput, "Solid oxide membrane technology for environmentally sound production of titanium," Mineral Processing and Extractive Metallurgy, vol. 117, No. 2, pp. 118-122, 2008.

Šesták and P. Šimon, Thermal analysis of Micro, Nano- and Non-Crystalline Materials: Transformation, Crystallization, Kinetics and Thermodynamics. Springer, 2013, p. 484.

* cited by examiner

Figure 26: Aluminum – Silicon Phase Diagram (9).

T.B. Massalski et al., Binary Alloy Phase Diagrams, 2nd ed., ASM International, Materials Park, Ohio, US, 1996

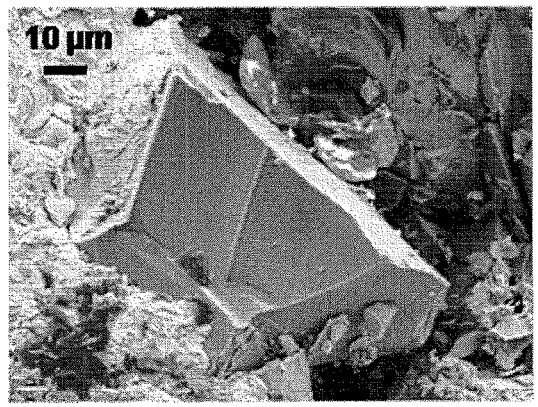 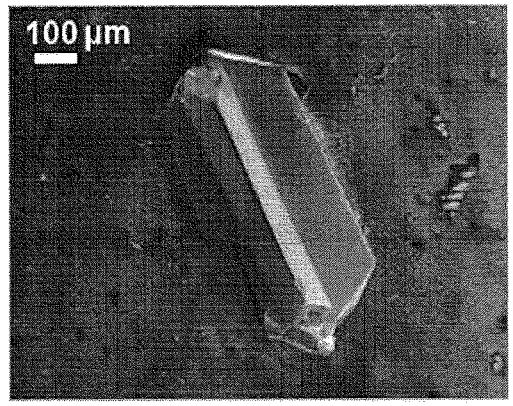
Fig. 4A          Fig. 4B
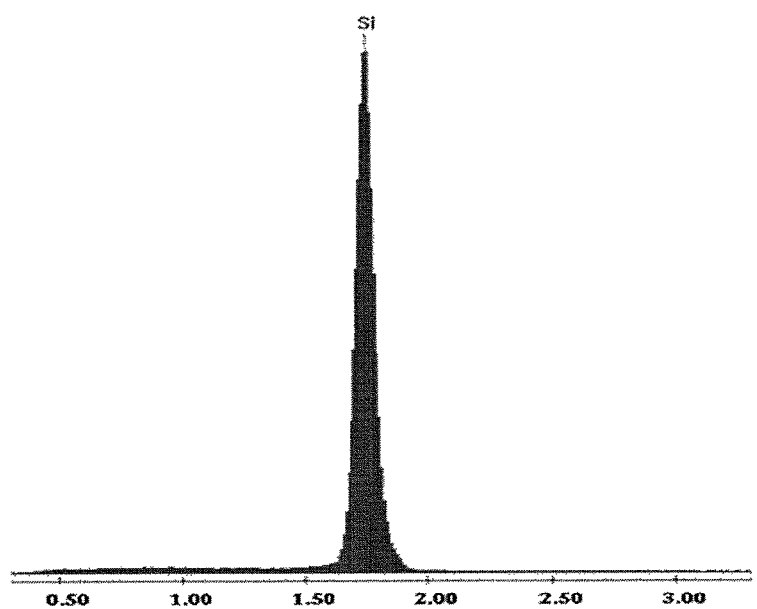
Fig. 5

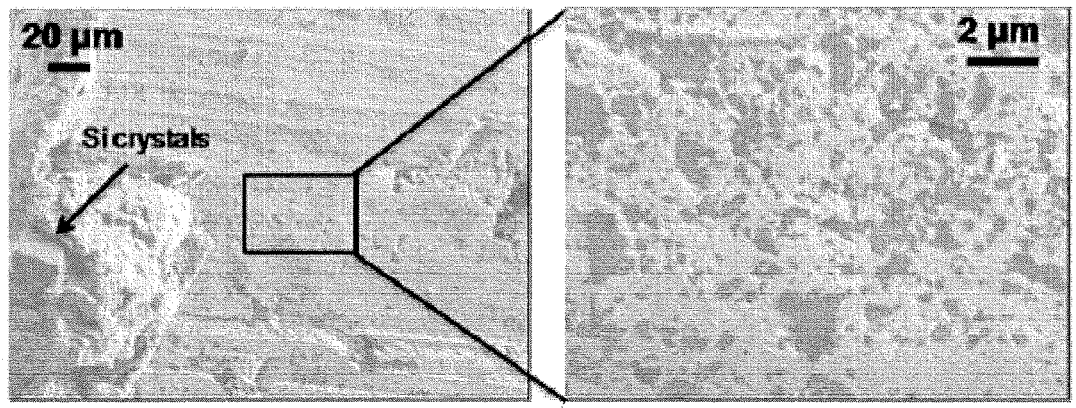
Fig. 8A          Fig. 8B
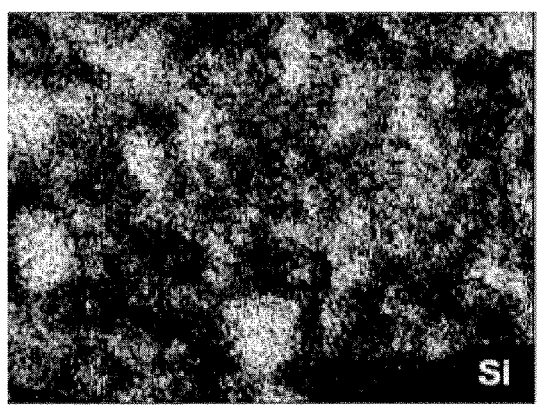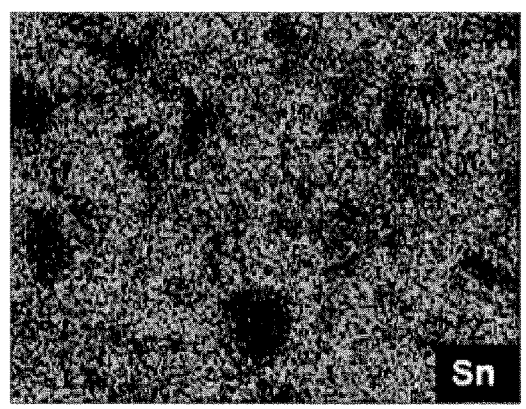
Fig. 9A          Fig. 9B

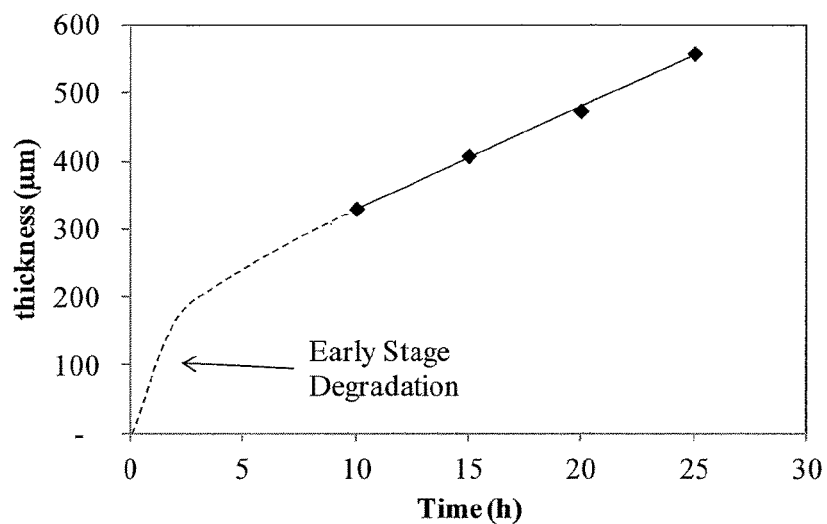
Fig. 23
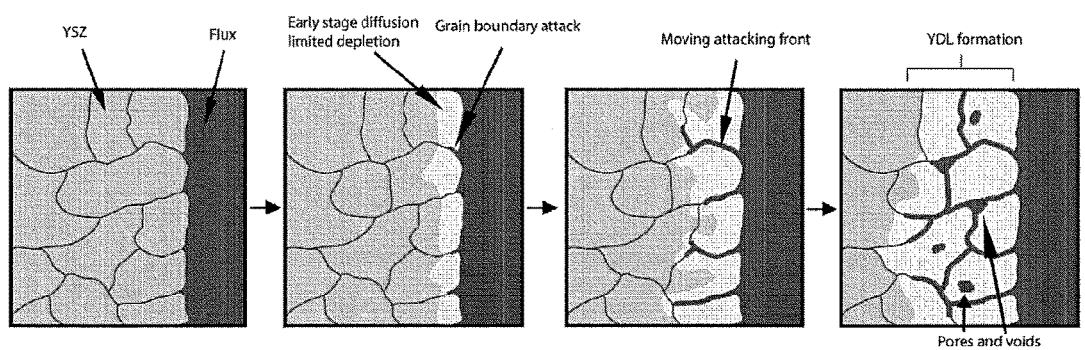
Fig. 24A  Fig. 24B  Fig. 24C  Fig. 24D

METHOD AND APPARATUS FOR PRODUCING SOLAR GRADE SILICON USING A SOM ELECTROLYSIS PROCESS

CROSS-REFERENCE OF RELATED APPLICATION

This application is a U.S. National Stage of International Application No. PCT/US2013/072025 filed Nov. 26, 2013 which claims benefit to U.S. Provisional Application No. 61/730,880 filed Nov. 28, 2012, each of which is hereby incorporated herein by reference in their entireties.

STATEMENT OF GOVERNMENT SUPPORT

This invention was made with U.S. Government support under Grant No. CBET 1210442, awarded by the National Science Foundation. The Government has certain rights in this invention.

TECHNICAL FIELD

The field of the currently claimed embodiments of this invention relates to a method and apparatus for producing solar grade silicon. In particular, this invention relates to production of solar grade silicon from silica using a solid oxide membrane (SOM) electrolysis process.

BACKGROUND

To reduce dependence on non-renewable fossil energy sources, the investment and need of alternative energy sources, such as solar-photovoltaics, are growing rapidly. Photovoltaics (PV) generate electrical power by using solar cells, and dramatically reduce the emissions of greenhouse gases (GHG). Through 2006 to 2011, photovoltaics grew the fastest of all renewable technologies with operating capacity increasing an average of 58% annually. However, the cost of manufacturing solar-grade silicon (SoG-Si) for high-efficiency solar energy production represents a major barrier to achieving the industrial goal for solar power of $1/Wp (watt at peak exposure) which would enable widespread grid parity. The current contract price of silicon to PV manufacturers is $50-$60/kg, with the spot market in 2007-2008 showing prices as high as $300/kg. This makes the development of low cost and environmentally friendly manufacturing of high purity silicon very important.

According to existing methods, over 90% of silicon produced requires a purification process, which involves chlorination, distillation and chemical vapor deposition, after metallurgical-grade (MG) Si is manufactured by carbothermic reduction of silica. One such process, known as the Siemens process, includes multiple steps, has low capital utilization, but is extremely energy-intensive, and produces much higher product purity (10 to 11 nines) than what the solar cells need (6 nines). The Siemens process has been the primary method of silicon production. In order to reduce the high cost of silicon production, several alternate processes of silicon production are being developed, and some of them have achieved varying levels of success. These include, reduction processes in fluidized bed reactors, carbothermic reduction of high-purity silica, slag/crystal refining, liquid silicon electro-refining, among others. However, disadvantages of these processes are expensive raw materials pre-processing, detrimental environmental impact, substantial energy requirements and relatively low yields.

In view of the above, there is a need for an environmentally friendly and cost effective method of producing silicon.

SUMMARY

According to an embodiment of the invention, a method of manufacturing silicon via a solid oxide membrane electrolysis process is provided. The method includes providing a crucible defining a cavity and providing a flux within the cavity of the crucible, the flux including silica in solution. The method also includes providing a cathode disposed in the cavity of the crucible in electrical contact with the flux, the cathode including a silicon-absorbing portion in fluid communication with the flux. The method further includes providing an anode disposed in the cavity of the crucible and spaced apart from said cathode and being in electrical contact with the flux, the anode including a solid oxide membrane around at least a portion of the anode. Further, the method includes generating an electrical potential between the cathode and the anode sufficient to reduce silicon at an operating temperature of the solid oxide membrane electrolysis process, and cooling the silicon-absorbing portion to a precipitation temperature that is below the operating temperature and at which the silicon precipitates out of the silicon-absorbing portion. The silicon-absorbing portion preferentially absorbs silicon relative to a remainder of the flux at the operating temperature, the silicon-absorbing portion is a liquid metal at the operating temperature, and the solid oxide membrane is permeable to oxygen.

According to an embodiment of the invention, an apparatus for manufacturing silicon via a solid oxide membrane electrolysis process is provided. The apparatus includes a crucible defining a cavity and an anode disposed in the cavity of the crucible. The anode includes a solid oxide membrane around at least a portion of the anode. The apparatus also includes a cathode disposed in the cavity of the crucible and spaced apart from the anode, the cathode including a silicon-absorbing portion within a second crucible. The silicon-absorbing portion is a liquid metal at an operating temperature of the solid oxide membrane electrolysis process, and the solid oxide membrane is permeable to oxygen.

BRIEF DESCRIPTION OF THE DRAWINGS

Further objectives and advantages will become apparent from a consideration of the description, drawings, and examples.

FIG. 4A shows an SEM image of a silicon deposit on the surface of a tin cathode according to an embodiment of the current invention.

FIG. 4B shows an SEM image of a silicon deposit on the surface of a tin cathode according to an embodiment of the current invention.

FIG. 5 shows a graph obtained by energy-dispersive x-ray spectroscopy of a silicon sample formed according to an embodiment of the current invention.

FIG. 8A shows an SEM image of silicon crystals formed on a cross-section of a tin silicon-absorbing portion of a cathode according to an embodiment of the current invention.

FIG. 8B shows a zoomed-in view of the SEM image of silicon crystals shown in FIG. 9A according to an embodiment of the current invention.

FIG. 9A shows an image of element mapping of Si in the section shown in FIG. 8B using energy-dispersive x-ray spectroscopy according to an embodiment of the current invention.

FIG. 9B shows an image of element mapping of Sn in the section shown in FIG. 8B using energy-dispersive x-ray spectroscopy according to an embodiment of the current invention.

FIG. 23 shows YDL thickness versus stability test with different time length according to an embodiment of the current invention.

FIG. 24A shows a schematic of the starting YSZ bordering the flux before being degraded by being exposed to flux at an elevated temperature according to an embodiment of the invention.

FIG. 24B shows a schematic of the YSZ after initiation of a grain boundary attack according to an embodiment of the invention.

FIG. 24C shows a schematic of the YSZ after furthering of the grain boundary attack shown in FIG. 24B according to an embodiment of the invention.

FIG. 24D shows a schematic of the YSZ with pores and voids formed in the YDL according to an embodiment of the invention.

DETAILED DESCRIPTION

Some embodiments of the current invention are discussed in detail below. In describing embodiments, specific terminology is employed for the sake of clarity. However, the invention is not intended to be limited to the specific terminology and examples selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated. All references cited in this specification are incorporated herein by reference.

The term "crucible" as used herein may refer to any container or divided region capable of holding a material in molten or liquid form. The material need not be kept entirely separate from other materials, but confines a material on at least one side.

The Solid Oxide Membrane (SOM) electrolysis process is a novel single-step process for metals production directly from their oxides. It is cost-effective and environmentally friendly. With proper selection of flux, cathode material, and cathode design, solar grade (SoG) silicon (Si) can be produced from any source of silica (including sand) using the SOM process. Described herein are methods and systems for producing solar grade silicon using the SOM process, including choice of flux, cathode material, and cathode design for solar grade silicon production by the SOM process. The result is a solar grade silicon production process that is more environmentally friendly and contains fewer greenhouse gases than existing methods of silicon production.

Figure 1:
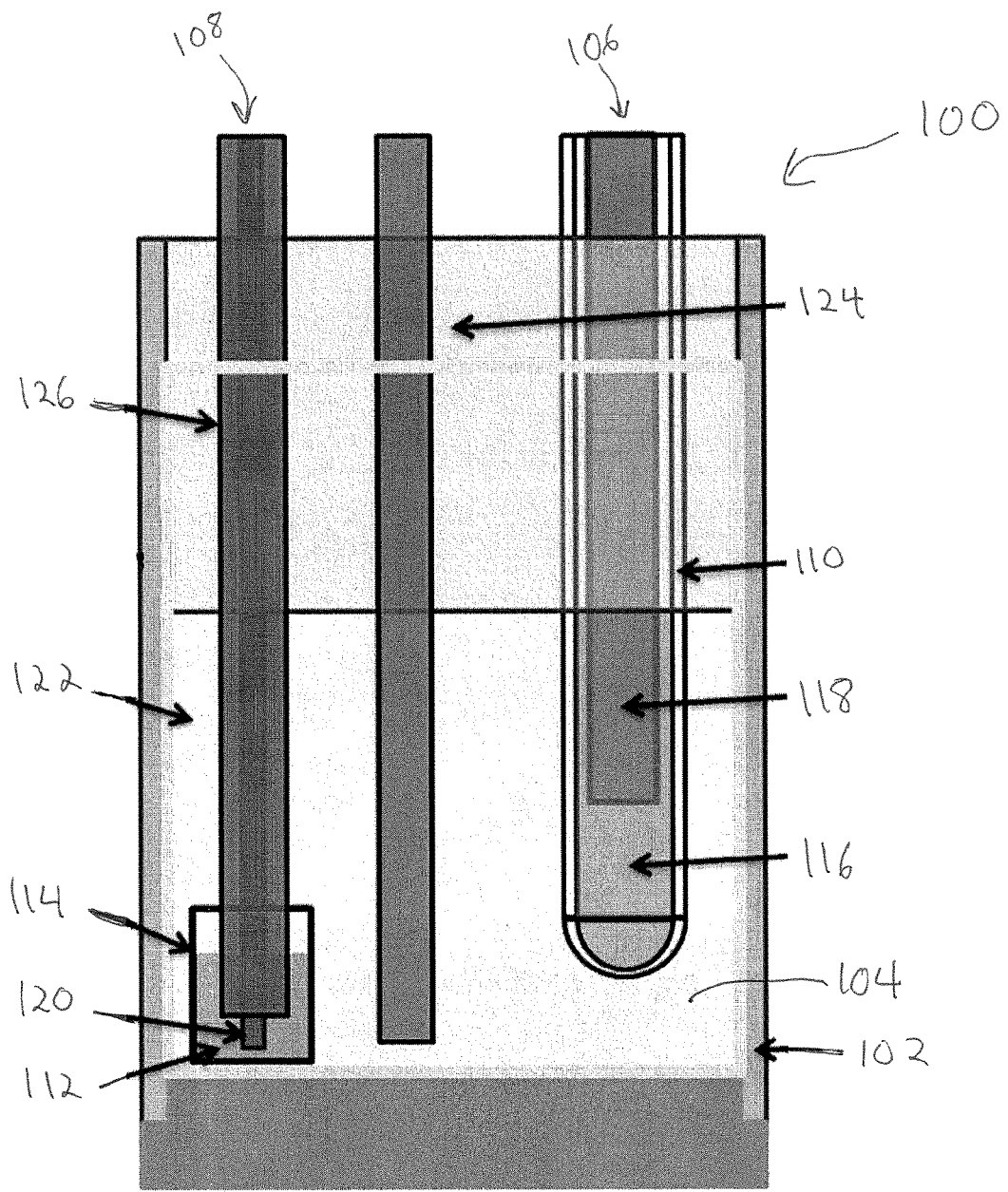
FIG. 1 shows a schematic diagram of a system for performing a SOM electrolysis process according to an embodiment of the current invention.

FIG. 1 shows a SOM electrolysis apparatus 100, according to an embodiment of the invention, for manufacturing silicon via a solid oxide membrane electrolysis process.

As shown in FIG. 1, the apparatus may include a crucible 102 defining a cavity 104. An anode 106 and a cathode 108 are disposed in the cavity 104 of the crucible 102, and are spaced apart from each other. The anode 106 includes a solid oxide membrane (SOM) 110 around at least a portion of the anode 106. The cathode 108 includes a silicon-absorbing portion 112 within a second crucible 114 that is also disposed in the crucible 102. The silicon-absorbing portion 112 is a liquid metal at an operating temperature $T_o$ of the solid oxide membrane electrolysis process. The operating temperature may be, for example, 900° C. to 1500° C.

In an embodiment, the anode 106 also includes a liquid metal anode portion 116 that is liquid at the operating temperature $T_o$. The anode may also include a current collector 118. The current collector may be made from molybdenum, for example, but is not limited thereto as other materials may be suitable, as well.

The cathode 108 may further include a current collector 120 in contact with the silicon-absorbing portion 112. The current collector 120 may be made tungsten, for example, but is not limited to tungsten.

In some embodiments, the apparatus 100 may also include an inert-gas-bubbling tube 124 that can bubble an inert gas, including, for example, Ar, He, H, or a combination of those elements.

The SOM 110 is permeable to oxygen. In some embodiments, the SOM 110 may include zirconium oxide, or cerium oxide. The SOM 110 may additionally include a stabilizing element that can be at least one or more oxides of yttrium, calcium, scandium, and magnesium.

As shown in FIG. 1, the apparatus may also include a flux 122 within the cavity 104 of the crucible 102, according to an embodiment. The flux 122 may be provided in fluid communication with the silicon-absorbing portion 112 and in electrical contact with the anode 106, and include a silicon oxide in solution, such as silica, for example. The flux 122 may include an oxide of at least one of yttrium, calcium, barium, and magnesium. For example, the oxide or oxides in the flux 122 may have an element corresponding to the element used in the stabilizing element in the SOM 110. For example, the oxide of the flux 122 may be at least one of CaO, MgO, and $Y_2O_3$.

An acceptable material for the silicon-absorbing portion 112 may be determined based on a number of properties. For example, the silicon-absorbing portion 112 may have a lower melting temperature than that of silicon. Thus, upon cooling the system from the operating temperature $T_o$ to a temperature below the operating temperature $T_o$, the silicon can precipitate in solid form while the silicon-absorbing portion 112 remains a liquid. The silicon-absorbing portion may also have a higher density than the flux 122 at the operating temperature $T_o$. The silicon-absorbing portion may be chosen, for example, from one of tin, aluminum, and bismuth.

Similarly, the flux 122 may be chosen or adjusted according to various properties. For example, at said operating temperature $T_o$, the flux 122 may have an ionic conductivity of at least 2 S/cm. The flux 122 may have an oxide solubility of at least 0.5 wt % at the operating temperature $T_o$. The oxide solubility may be, for example, about 1 to 10 wt %. At the operating temperature $T_o$, the flux 122 may also have a viscosity of less than 0.1 Pa·s. Further, the flux 122 may have a volatility of less than $10^{-6}$ g/cm$^2$s at the operating temperature $T_o$. At the operating temperature $T_o$, the flux 122 may also be relatively inert with respect to the solid oxide membrane 110.

As for composition, the flux 122 may include halides that have cations with a lower electronegativity than silicon. For example, the halides can include at least one of magnesium, barium, calcium, and lithium. In some embodiments, the flux comprises 10-50 wt % $MgF_2$, 2-5 wt % $YF_3$, and 1 to 7 wt % $SiO_2$, with a balance of $BaF_2$. More particularly, the flux 122 of an embodiment is 76.8 wt % $BaF_2$, 15.2 wt % $MgF_2$, 5 w % $YF_3$, and 3 wt % $SiO_2$.

The cathode may also include a tube sleeve 126 covering a substantial portion of the cathode 108, surrounding a substantial portion of the current collector 120. However, the current collector 120 may extend past the tube sleeve 126 and into the silicon-absorbing portion 112. In an embodiment, the tube sleeve 126 is made of yttria-stabilized zirconia (YSZ), but is not limited thereto.

In an embodiment, a method of manufacturing silicon via a solid oxide membrane electrolysis process is provided. The method may employ a system or apparatus such as the SOM electrolysis apparatus 100 shown in FIG. 1. The method includes providing a crucible 102 defining a cavity 104, and providing a flux 122 within the cavity 104 of the crucible 102. The method further includes providing a cathode 108 within the cavity 104 of the crucible 102 and in electrical contact with the flux 122, and providing an anode 106 within the cavity 104 of the crucible 102. The anode 106 is spaced apart from the cathode 108 and also in electrical contact with the flux 122. Additionally, the cathode 108 includes a silicon-absorbing portion 112 in fluid communication with the flux 122, and the anode 106 includes a solid oxide membrane (SOM) 110 around at least a portion of the anode 106. The SOM 110 is permeable to oxygen.

The method further includes generating an electrical potential between the cathode 108 and anode 106. The electrical potential may be sufficient to reduce silicon at an operating temperature $T_o$ of the SOM electrolysis process. The method also includes cooling the silicon-absorbing portion 112 to a precipitation temperature $T_p$ that is below the operating temperature $T_o$ and at which the silicon precipitates out of the silicon-absorbing portion 112. In addition, the silicon-absorbing portion 112 may a liquid metal at the operating temperature $T_o$.

Figure 2A:
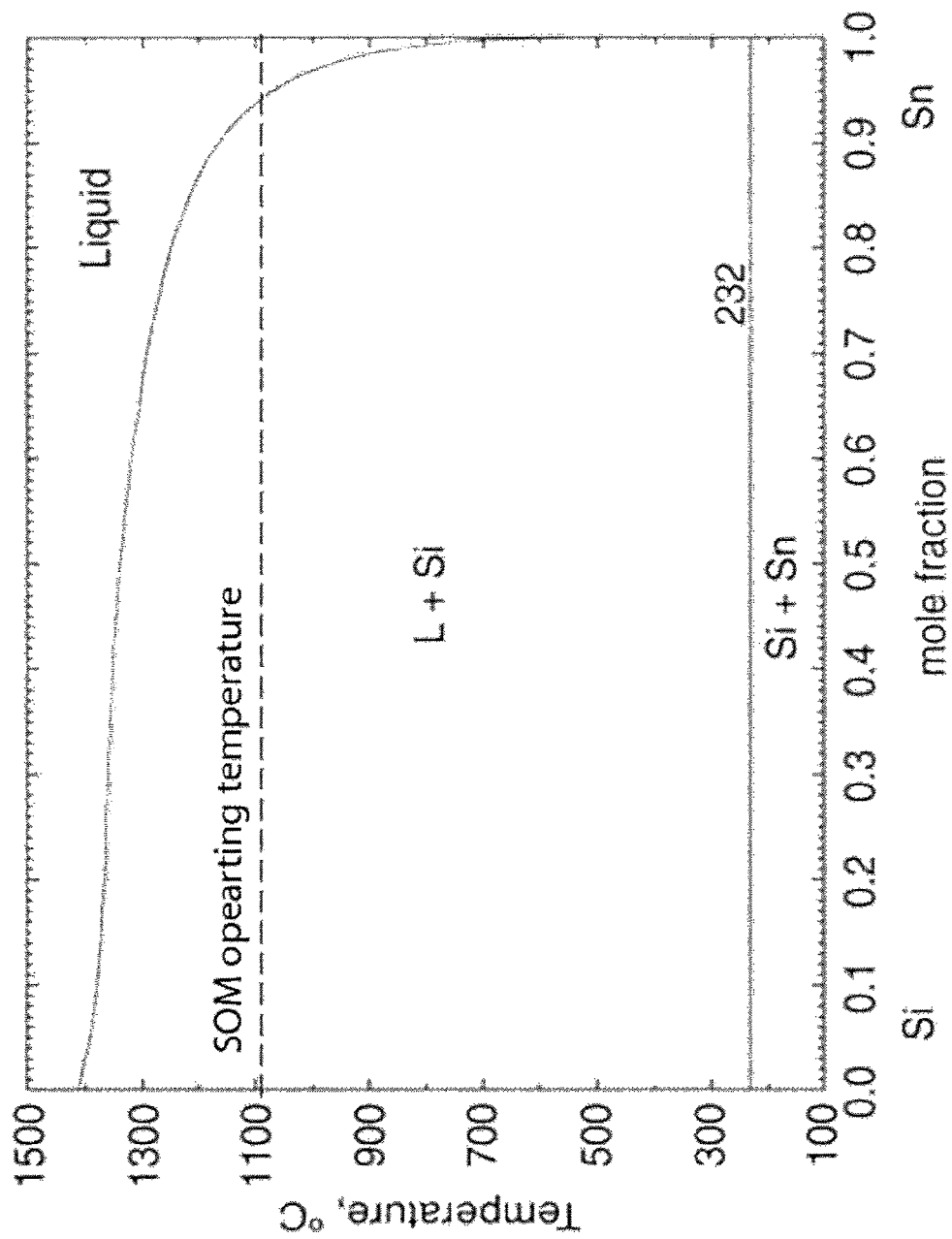
FIG. 2A shows a tin-silicon phase diagram and SOM operating temperature according to an embodiment of the current invention.

FIG. 2A, for example, shows a phase diagram for a silicon-tin (Si—Sn) system. A SOM operating temperature of about 1100° C. is overlaid on the phase diagram. Thus, at certain relative compositions, the silicon-absorbing portion 112, which is made of tin in this example, and the silicon are both liquid above the operating temperature $T_o$. However, the temperature may be lowered to a point where tin remains liquid but silicon becomes solid.

Figure 2B:
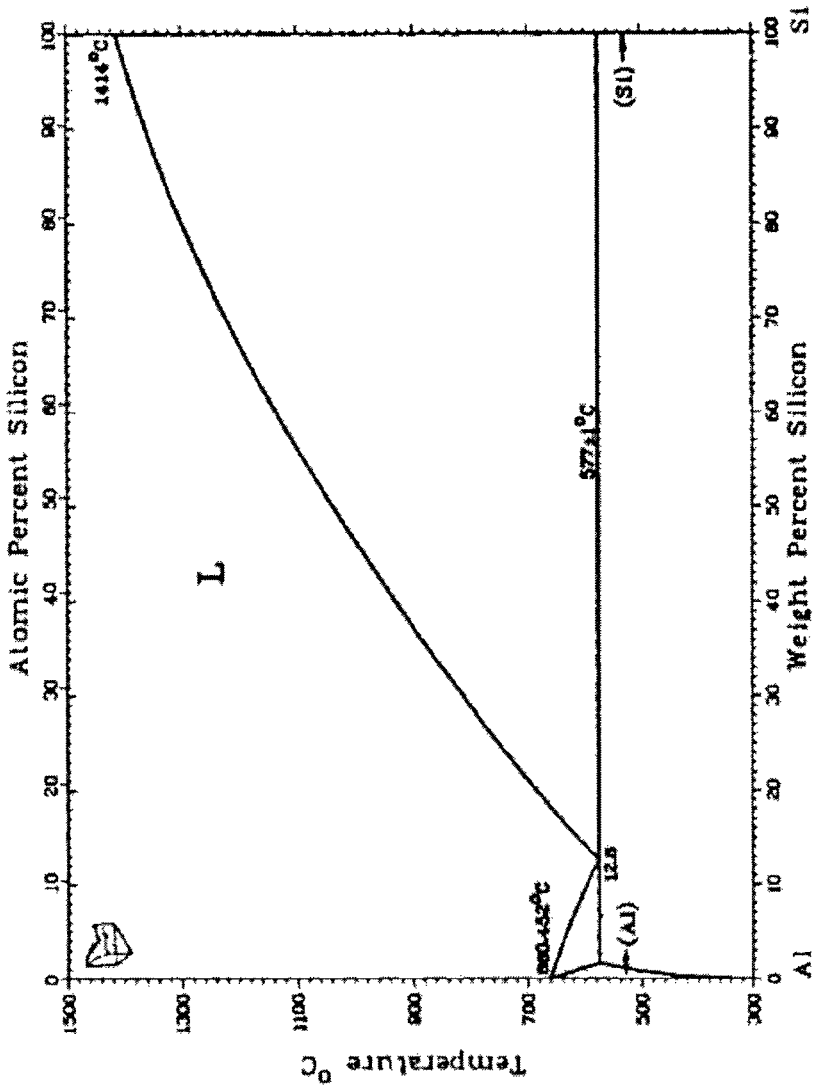
FIG. 2B shows an aluminium-silicon phase diagram relevant to an embodiment of the current invention.
Figure 2C:
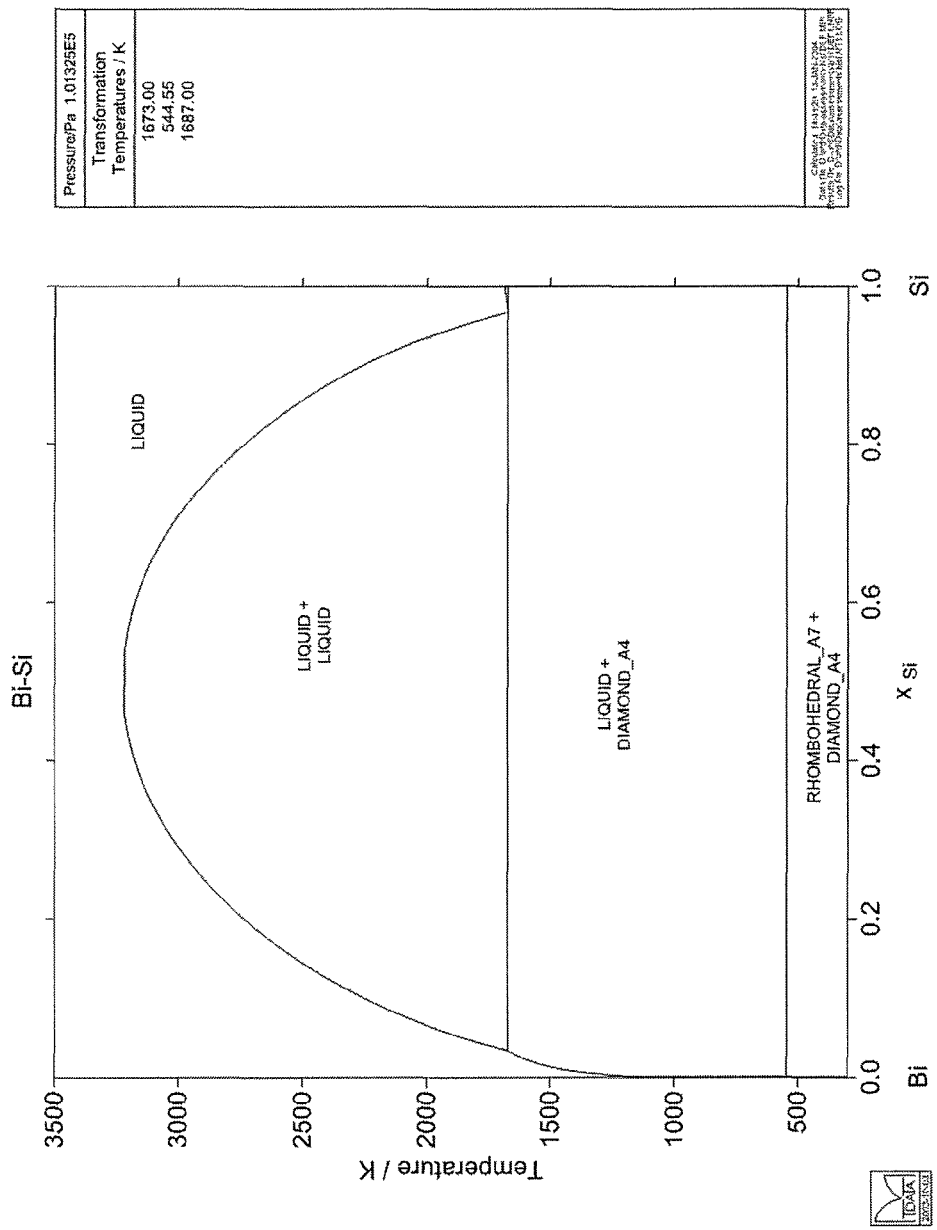
FIG. 2C shows a bismuth-silicon phase diagram relevant to an embodiment of the current invention.
Figure 3A:
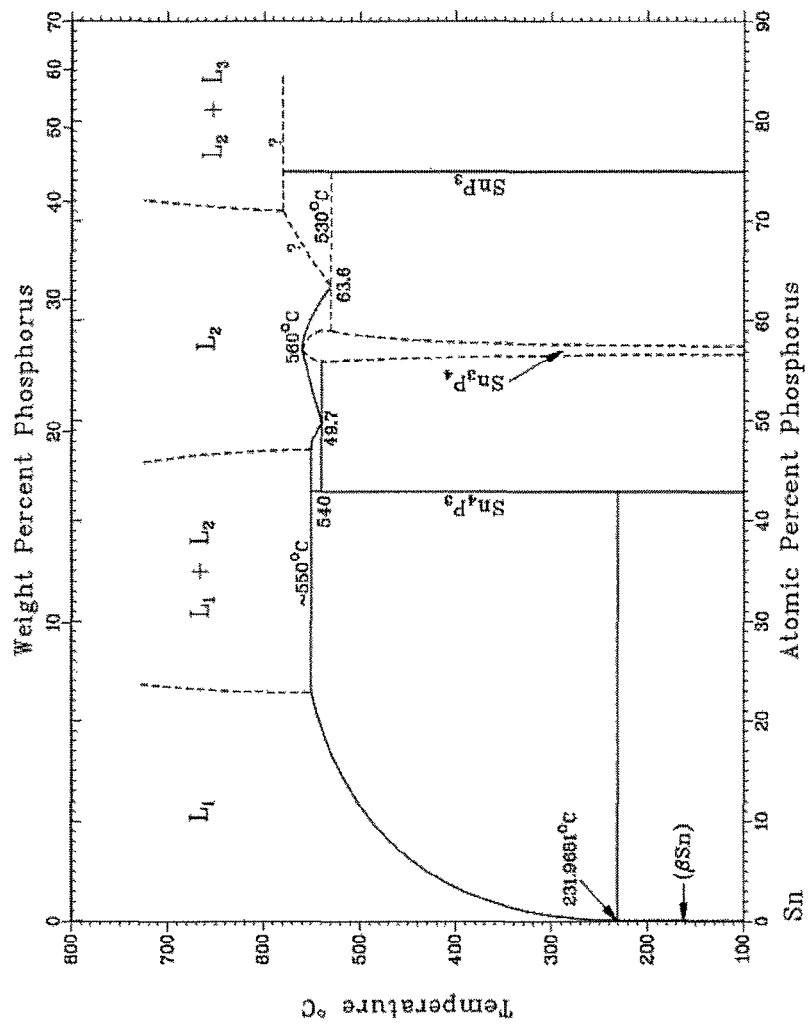
FIG. 3A shows a tin-phosphorus phase diagram relevant to an embodiment of the current invention.
Figure 3B:
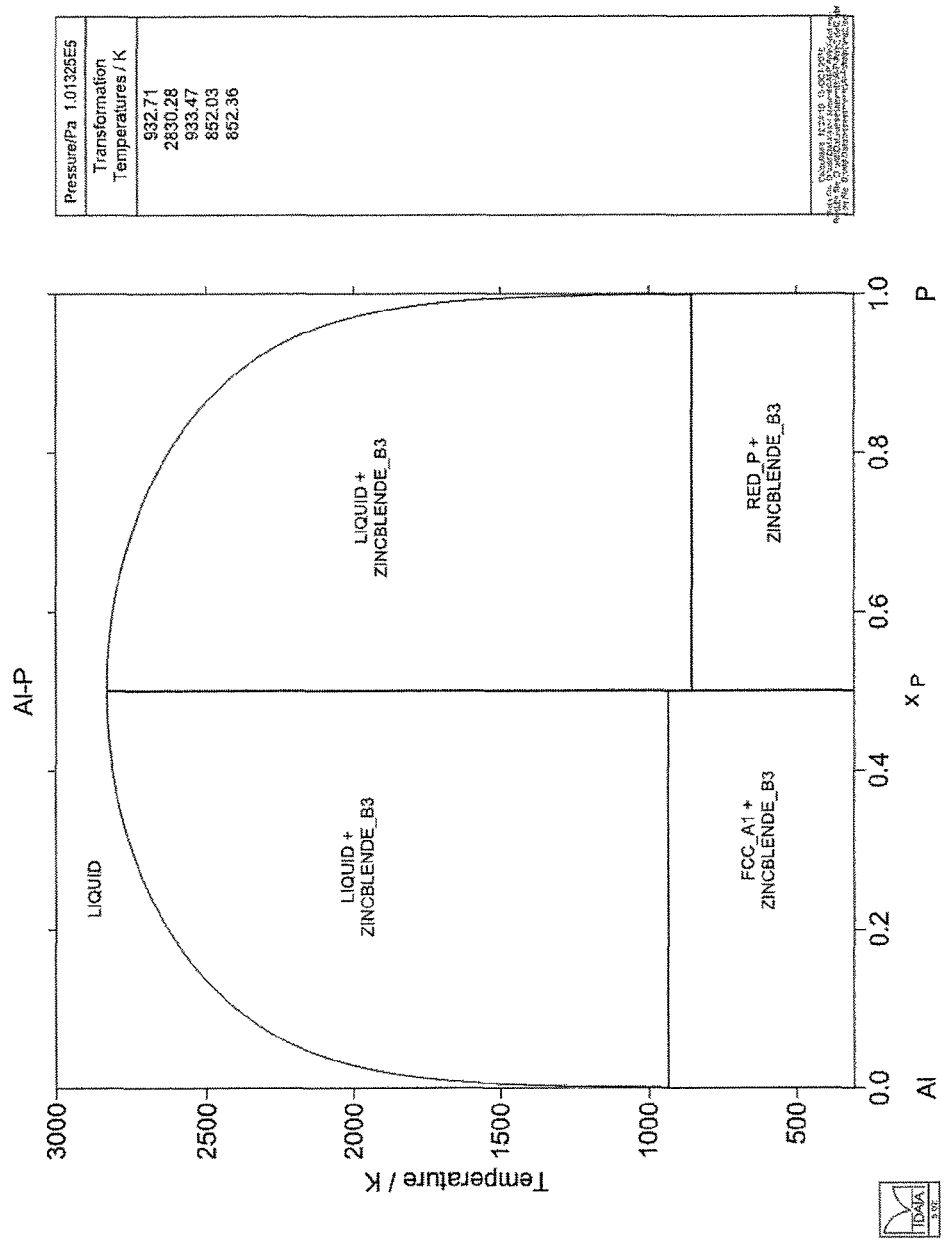
FIG. 3B shows an aluminium-phosphorus phase diagram relevant to an embodiment of the current invention.
Figure 3C:
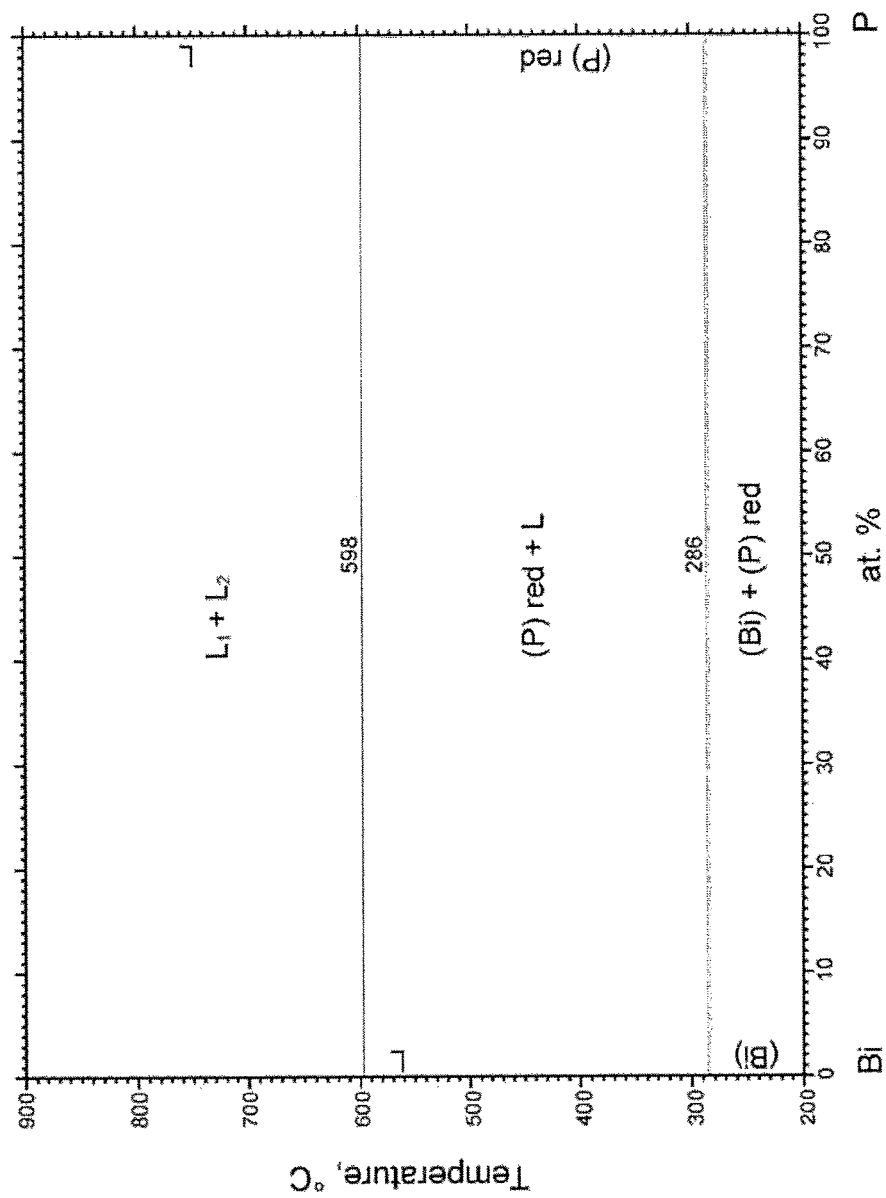
FIG. 3C shows a bismuth-phosphorus phase diagram relevant to an embodiment of the current invention.
Figure 3D:
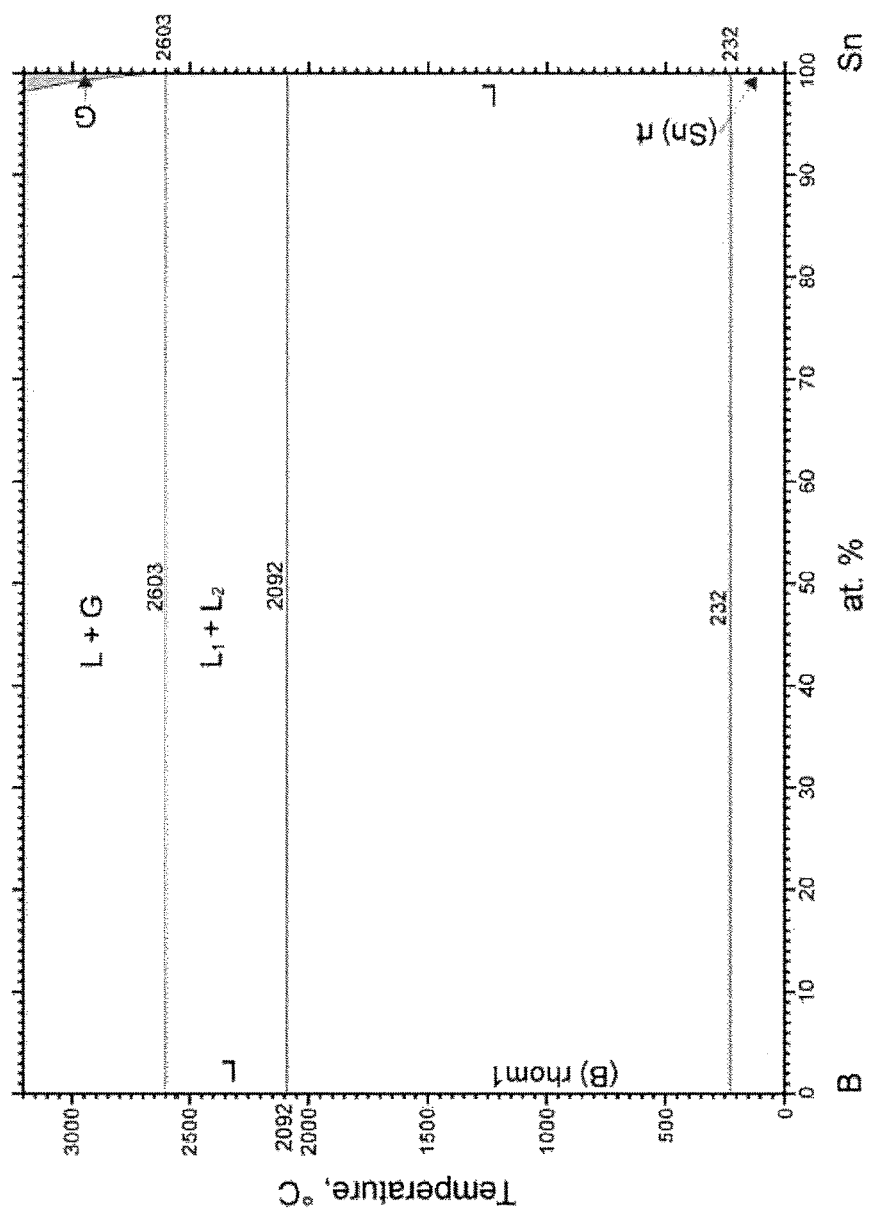
FIG. 3D shows a tin-boron phase diagram relevant to an embodiment of the current invention.
Figure 3E:
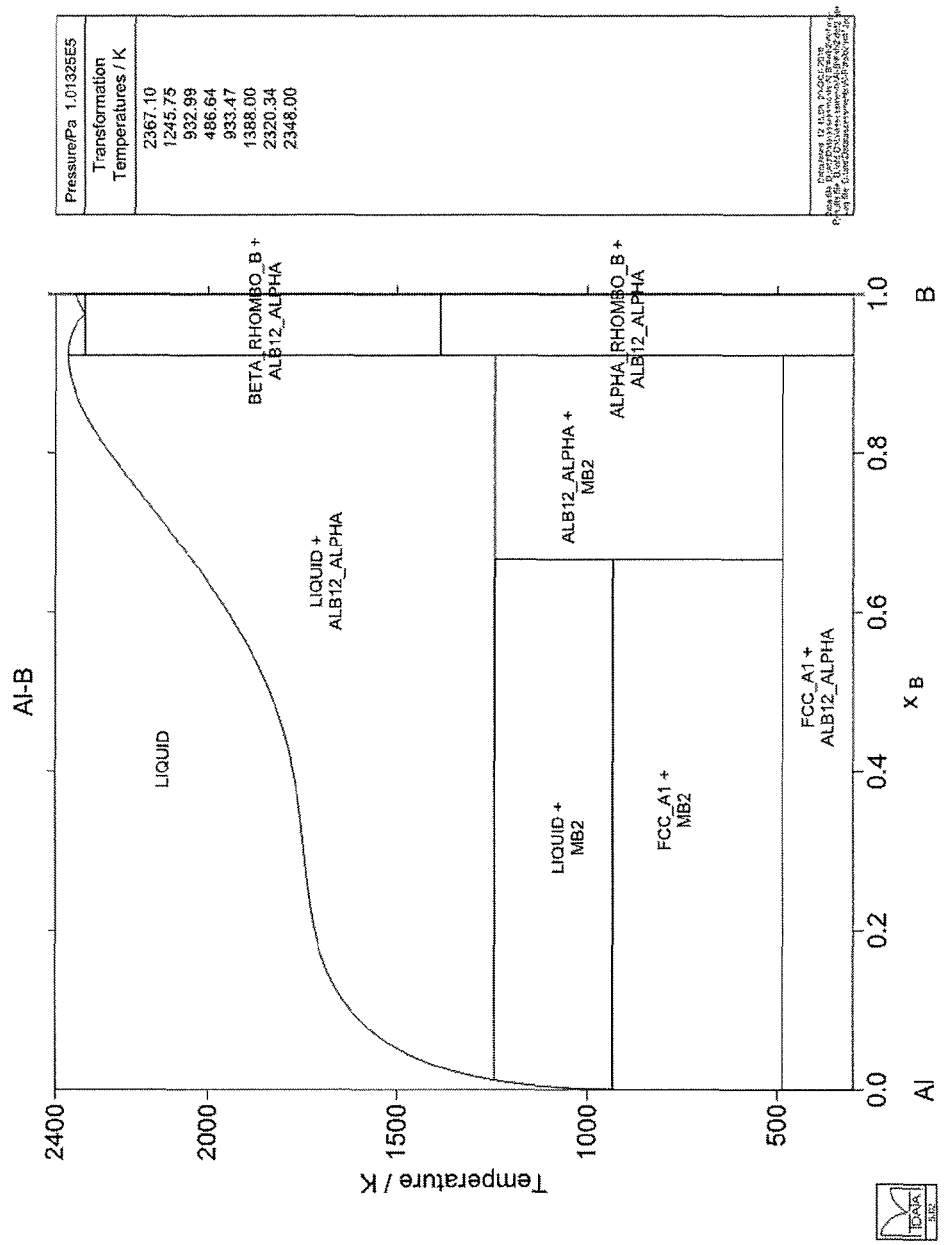
FIG. 3E shows an aluminium-boron phase diagram relevant to an embodiment of the current invention.
Figure 3F:
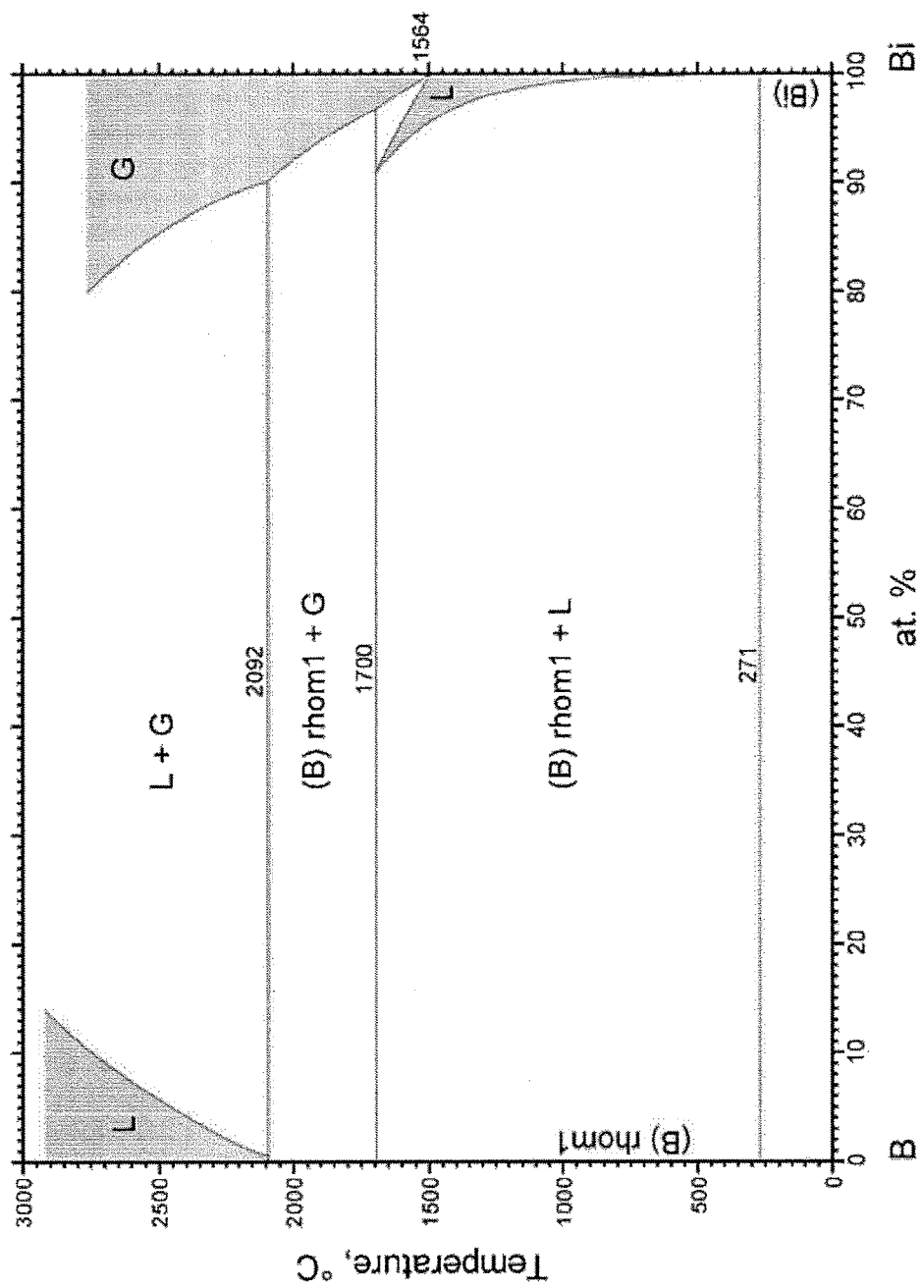
FIG. 3F shows a bismuth-boron phase diagram relevant to an embodiment of the current invention.

FIGS. 2B and 2C show phase diagrams for an aluminium-silicon (Al—Si) system (FIG. 2B) and a bismuth-silicon (Bi—Si) system (FIG. 2C) that can be applied in embodiments where the silicon-absorbing portion 122 is made of Al and Bi, respectively.

The silicon-absorbing portion 112 may preferentially absorb silicon relative to remaining components of the flux 106 at the operating temperature $T_o$. As indicated by FIGS. 3A, 3B, 3C, 3D, 3E, and 3F, other impurities that may be in or absorbed into the silicon-absorbing portion 112 may remain behind in the silicon-absorbing portion 112 even when the temperature is lowered. Thus, high-purity Si can be obtained that is relatively free of impurities.

For example, FIGS. 4A and 4B show SEM images of Si deposits formed on a surface of the silicon-absorbing portion 112 as a result of a process according to an embodiment of the invention. FIG. 5 shows the results of energy-dispersive X-ray spectroscopy conducted on a sample from the Si deposits shown in FIGS. 4A and 4B. FIG. 5 indicates the high purity of the Si obtained.

The method may also include stirring the flux 106 with an inert-gas-bubbling tube 116. Stirring the flux 106 may lower the mass transfer resistance on the cathodic side of the SOM electrolysis apparatus 100. The inert gas may be, for example, Ar, He, H, or a combination of those elements.

When generating the electrical potential, the method may also include increasing the electrical potential at about 5 mV/s until the electrical potential reaches or exceeds the dissociation potential of silicon oxide. The dissociation potential may be, for example, at least 0.8 V. In some embodiments, the operating temperature may be from 800° C. to 1500° C.

The following provides some examples according to some embodiments of the current invention. The general concepts of the current invention are not limited to these particular examples that are provided to explain concepts of the current invention.

EXAMPLES

Example 1

The Solid-Oxide Oxygen-Ion-Conducting Membrane (SOM) electrolysis process has been successfully tested on a laboratory scale, producing silicon directly from silica in a cost-effective and environmentally friendly way. A yttria-stabilized zirconia (YSZ) tube, closed at one end was employed to separate the molten salt containing dissolved silica from a liquid metal anode placed inside the YSZ tube. When the applied electric potential between the liquid tin cathode in the molten salt and the anode exceeds the dissociation potential of silica, oxygen ions are pumped out of the molten salt through the YSZ membrane and oxidized at the anode while the silicon cations in the flux are reduced to silicon at the liquid tin cathode. The presence of high-purity silicon crystals on the surface of liquid tin cathode was confirmed by scanning electron microscopy (SEM) and energy dispersive x-ray spectroscopy (EDS). Silicon crystals were extracted from tin cathode by chemical etching.

3 weight percent (wt %) silicon dioxide ($SiO_2$) and 5 wt % yttrium fluoride ($YF_3$) were added into an eutectic mix of magnesium fluoride-barium fluoride ($MgF_2$—$BaF_2$) powder (16.5 wt % $MgF_2$ and 83.5 wt % $BaF_2$), and the well-mixed powders were heated to 1090° C. in a zirconia crucible to create a homogenous mixture of $MgF_2$—$BaF_2$—$YF_3$-$SiO_2$ flux, serving as the liquid electrolyte for the experiments. The schematic of the SOM experimental setup for $SiO_2$ electrolysis is shown in FIG. 1. A tungsten (W) rod covered by a YSZ tube sleeve was used as the cathode. This was immersed in the extended tin (Sn) cathode contained by a small zirconia crucible. In order to avoid contamination, another YSZ tube was employed as a stirring tube by bubbling forming gas (5% $H_2$-95% Ar) through the molten flux. In the SOM experiment, 100% pure hydrogen gas was passed through a molybdenum (Mo) tube at the anode side, so a low $pO_2$ could be established by reacting hydrogen with the oxygen ions migrating through the YSZ membrane. The low $pO_2$ inside the YSZ membrane not only prevented oxidation of the liquid tin anode, but also facilitated the diffusion of oxygen ions through the membrane by creating a driving force due to the $pO_2$ difference.

A homogenous molten flux was prepared by melting the mixed powders at the SOM operating temperature (1090° C.) in an inert forming gas (5% $H_2$—Ar) ambient. In order to produce Si directly from dissolved silicon dioxide in the flux, an electric potential was applied between the tin anode inside the SOM tube and the W cathode as well as the extended tin cathode. Before the constant-potential SOM electrolysis was performed, a potentiodynamic scan (PDS) was performed to determine the dissociation potential of silicon dioxide.

The Si deposits were analyzed by scanning electron microscopy (SEM), energy-dispersive X-ray spectroscopy (EDS), and optical microscopy. The SEM/EDS was performed on Zeiss Supra 55VP SEM with a Genesis EDAX system.

Figure 6:
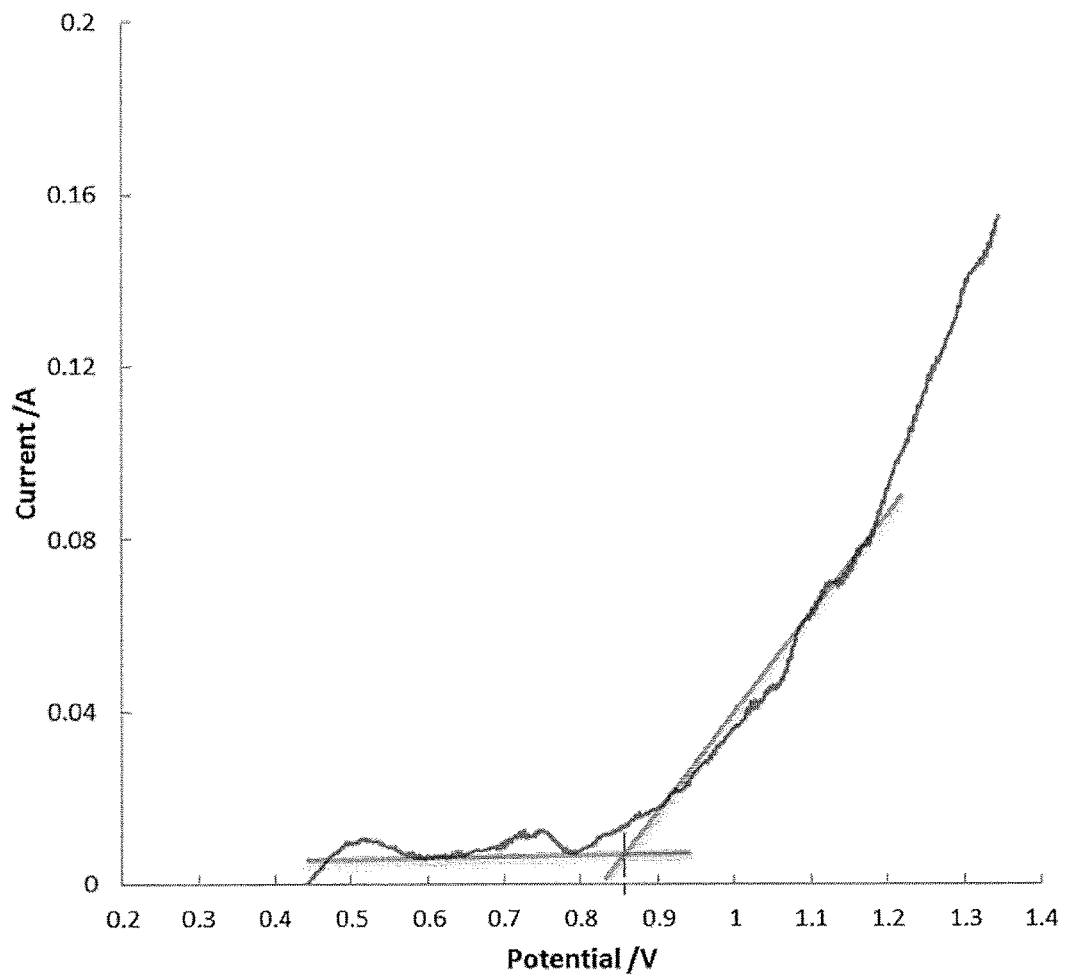
FIG. 6 shows a plot of current vs. potential from a potentiodynamic scan of a SOM process according to an embodiment of the current invention.

After SOM electrolysis, silicon deposits were produced on the extended tin cathode. The dissociation potential of silicon dioxide obtained from the potentiodynamic scan (PDS) is consistent with the theoretical value for the dissociation of $SiO_2$ as seen in FIG. 6. FIG. 6 indicates a dissociation potential of about 0.84 V.

Once the applied electric potential between the cathode and anode exceeded the dissociation potential of $SiO_2$, the oxygen anions ($O^{2-}$) started migrating through the YSZ membrane, reacting with pure hydrogen to form water vapor at anode side. Therefore, the half-cell reaction occurring at the anode side is:

$$2O^{2-}+2H_2(g) \rightarrow 2H_2O(g)+4e^- \quad (1)$$

At the same time, silicon cations ($Si^{4+}$) began to migrate toward the cathode, where silicon was reduced. This half-cell reaction can be expressed by following equation:

$$Si^{4+}+4e^- \rightarrow Si \quad (2)$$

The overall electrochemical reaction for this process is shown below:

$$SiO_2+2H_2(g) \rightarrow Si+2H_2O(g) \quad (3)$$

Figure 7:
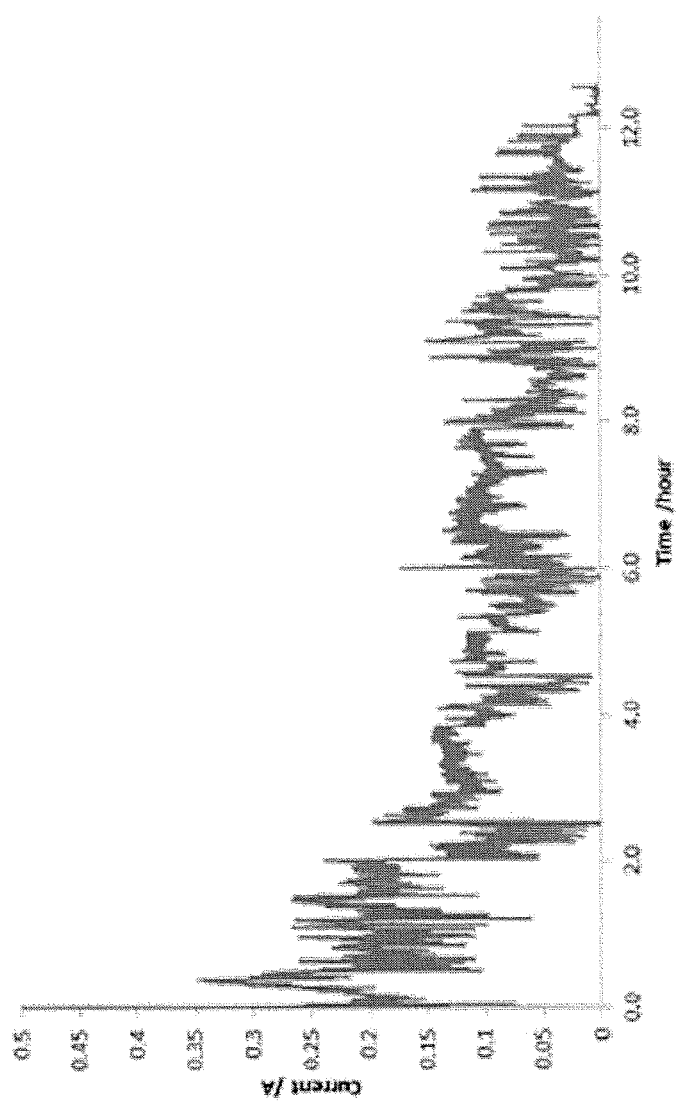
FIG. 7 shows a graph of a potentiostatic electrolysis scan of a SOM process according to an embodiment of the current invention.

FIG. 7 shows the results of a potentiostatic electrolysis scan of one run of the SOM process performed for 12 hours.

Since produced Si can react with W to form tungsten silicide, the YSZ tube sleeve was used to minimize the exposure area of the W rod and liquid tin was employed as an extended cathode during the SOM electrolysis. One of the advantages of using tin is that tin does not form compounds with silicon, based on Sn—Si phase diagram (see FIG. 2A, which was discussed above). In addition, the wettability between the molten cathode and silicon is of interest, since solid silicon deposits will be collected in the liquid tin cathode. It has been shown that tin does not wet silicon (contact angle)>90°, and the combination of heat treatment and reducing atmosphere of 5% $H_2/N_2$ yields a slightly lower contact angle (e.g. from 150° to 134°).

SEM images of the Si deposits on the surface of the extended tin cathode show them to silicon single crystals around 1 mm in size. Si deposits obtained from this Example are shown in FIGS. 4A and 4B, which were discussed above.

When the extended tin cathode was liquid at the SOM operating temperature, some of the silicon produced dissolved in liquid tin due to the significant solubility of silicon in tin at that temperature (see FIG. 2A). During the cooling process, the solubility of silicon in tin decreased, and silicon crystals precipitated.

For example, FIG. 8A shows an SEM image of the cross-section of extended tin cathode including Si crystals, and FIG. 8B shows a zoomed-in portion of a section in FIG. 8A. FIGS. 9A and 9B show an energy-dispersive x-ray spectroscopy (EDS) scan of the portion in FIG. 8B confirming that silicon crystals were surrounded by tin.

The EDS result indicates that the silicon deposits are free from contaminants, at least to the resolution of the EDS (see, for example, FIG. 5, as discussed above). Composition analyses of the deposits by more sensitive techniques such as Inductively Coupled Plasma/Mass Spectrometry (ICP/MS) are ongoing.

Figure 10A:
FIG. 10A shows an optical microscopy photograph of silicon crystals formed according to an embodiment of the current invention.
Figure 10B:
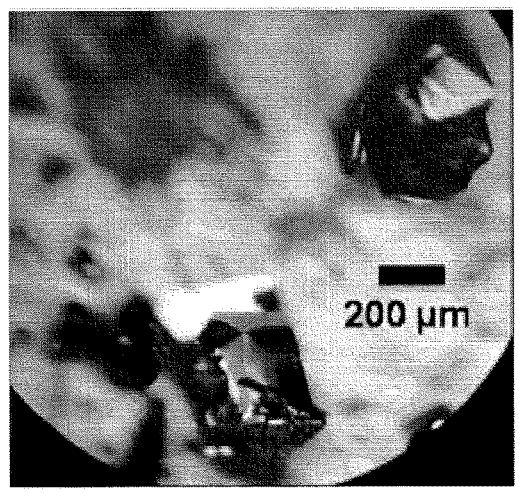
FIG. 10B shows an optical microscopy photograph of silicon crystals formed according to an embodiment of the current invention.

By using HCl chemical etching, silicon crystals were successfully extracted from the extended tin cathode. Optical micrographs of some of these Si crystals are shown in FIGS. 10A and 10B.

In the above Example, the feasibility of producing silicon directly from silica by employing the SOM electrolysis process was demonstrated by showing that dissolved $SiO_2$ in a molten flux can be dissociated to produce silicon with an applied potential. The presence of high purity silicon crystals was confirmed by SEM/EDS and these crystals were extracted by HCl chemical etching.

References for Example 1

[1] Renewable Energy Policy Network for the 21st century (REN21), Renewables 2012 Global Status Report, Paris 2012, pp. 47

[2] Polysilicon: Supply, Demand and Implications for the PV Industry 2008, Greentech Media/Prometheus Institute.

[3] L. C. Rogers, Handbook of Semiconductor Silicon Technology, W. C. O'Mara, R. B. Herring and L. P. Hunt, eds., Noyes Publications, New Jersey, 1990.

[4] Ajeet Rohatgi, "Impurities in Silicon Solar Cells," IEEE Trans. Electron. Devices ED-27(4) April 1980.

[5] L. J. Geerlings, P. Manshanden, G. P. Wyers, E. J. Ovrelid, O. S. Raaness, A. N. Waernes, and B. Wiersma, "Specification of Solar Grade Silicon: How Common Impurities Affect The Cell Efficiency of mc-Si Solar Cells," Eur. Photov. Solar Energy Conf. Barcelona, Spain, 6-10 Jun. 2005.

[6] Steve Amendola, "Method for Making Silicon for Solar Cells and Other Applications," PCT Patent Application: PCT/US2007/063985.

[7] Scott Nichol, "Method and Apparatus for refining MG silicon into SC silicon," International Patent Application: PCT/CA2007/000574.

[8] Kai Johansen, Donald R Sadoway, Bjorn Myhre, Marianne Engvoll and Krister Engvoll, "Method for Electrolytic Production and Refining of Metals," US Patent Application 2007/0215483.

[9] Sujit Das, "Primary Magnesium Production Costs for Automotive Applications," JOM 60 (11) 63 (2008).

[10] Uday B. Pal, Adam C. Powell, "The Use of Solid-oxide-membrane Technology for Electrometallurgy," Journal of the Minerals, Metals and Materials Society, 59 (5) (2007), 44-49.

[11] Yihong Jiang, Peter A. Zink, Uday B. Pal, "Solid Oxide Membrane Process for the Reduction of Uranium Oxide Surrogate in Spent Nuclear Fuel," ECS Transactions, 41 (33) 171-180 (2012)

[12] S. Sugihara and K. Okazaki, "Wetting of silicon single crystal by silver and tin, and their interfaces," Journal of materials science, vol. 28, pp. 2455-2458, 1993.

Example 2

A flux used in electrolyzing a oxide dissolved in a flux by the SOM process at the operating temperature may have the following features: high ionic conductivity (>2 S/cm), high oxide solubility (>0.5 w %), low viscosity (<0.1 Pa·s), low volatility (<10-6 g $cm^{-2}$ $sec^{-1}$), and little or no chemical interaction with the stabilized zirconia membrane (SOM). For silica electrolysis, the flux system can be based on halides, containing cations that have lower electronegativity than silicon (such as magnesium, barium, calcium, lithium, etc.). In order to operate at the lowest possible temperature, a eutectic mix based on the flux system chosen may be used. It may be possible to lower interactions with the SOM (yttria-stabilized zirconia membrane) by adding $YF_3$ to the flux in an amount that is sufficient to prevent the yttria from the membrane to go into solution in the flux. As an example, one may use the following flux composition: $BaF_2$(76.8 w %)-$MgF_2$(15.2 w %)-$YF_3$(5 w %)-$SiO_2$(3 w %). The solvent flux has a eutectic point of 910° C., and the SOM electrolysis may be performed between 1000-1200° C.

A schematic of the SOM experimental setup for $SiO_2$ electrolysis of Example 2 is shown in FIG. 1. A tungsten (W) rod can be used as the current collector. Any inert electronic conductor can be used. The current collector needs to contact a cathode, selected from a group of low melting metals/alloys (molten at the operating temperature), which has a finite solubility for silicon at the operating temperature and precipitates out only the silicon upon cooling after the SOM electrolysis. Such cathodes may be selected from a group of metals or their alloys such as tin, aluminum, bismuth, etc. If tungsten is used as the current collector, the Si that is deposited early on the tungsten forms an insulating tungsten silicide and prevents further deposition of the silicon on the current collector but rather continues the deposition in the molten cathode as dissolved silicon. Once the electrolysis is complete, the cathode is cooled and the silicon is precipitated out since there is no Si solubility in the cathode at lower temperatures (see FIGS. 2A-2C) and other impurities (such as P and B, for example) are left behind (see FIGS. 3A-F). This methodology enables production of pure silicon which is free of contaminants. An inert gas bubbling tube (made of, for example, zirconia, W, Mo, etc.) can be used to provide stirring in the flux in order to lower the mass transfer resistance on the cathodic side of the SOM electrolysis cell. The inert gas can be Ar, He, or a mixture of those elements with small amounts of hydrogen.

Pure oxygen can be produced at the anode when the anode is shielded from the molten salt by a SOM made of stabilized zirconia (such as yttria or calcia stabilized zirconia, CSZ or YSZ), which conducts oxygen ions and blocks other species. The anode is an electronically conducting oxide such as strontium or calcium doped lanthanum manganite (LSM or LCM) or strontium and cobalt doped lanthanum ferrite (LSCF), or a non-consumable liquid metal such as silver, for example. The electrical energy required can be lowered by employing a reactant at the anode such as hydrogen or carbon. In such a case, 100% pure hydrogen gas can be passed through a molybdenum (Mo) tube serving as the anodic current collector or carbon can be used as a consumable current collector. In the former, water is produced and in the latter carbon dioxide is produced as the anodic byproduct.

In this example, a degradation layer was observed between SOM membrane and the flux after the electrolysis process. Data showed that this degradation was caused by yttria depletion from the YSZ membrane, and further resulted in tetragonal (t)→monolithic (m) phase transformation. This degradation is unwanted because the t→m transformation is associated with a significant volume change and this volume change often leads to cracking inside the membrane. In order to prevent this degradation, one approach is to increase the activity of yttria in the flux by adding $YF_3$. A series of SOM membrane stability experiments were conducted to determine the degradation and yttrium depletion of the SOM membrane as a function of $YF_3$ concentration in the flux. The flux consisted of various amounts of silicon dioxide and yttrium fluoride, mixed with a eutectic composition of barium fluoride and magnesium fluoride. Open-ended YSZ SOM tubes were immersed in the flux and held for 10 hours. After the experiment, the YSZ membrane was removed and cut along the horizontal middle plane for examination.

Figure 11B:
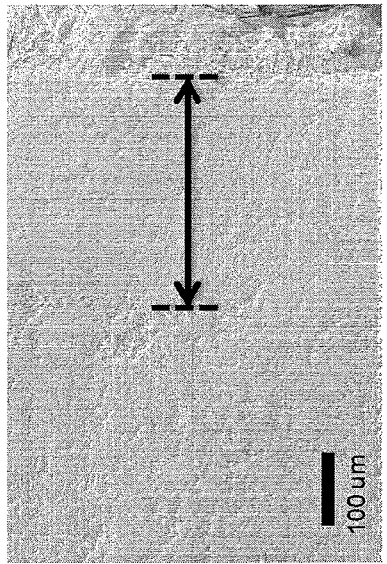
FIG. 11B shows a cross-section of a solid oxide membrane that has a degradation layer after being exposed to a flux with 1.5% $YF_3$ content.
Figure 11D:
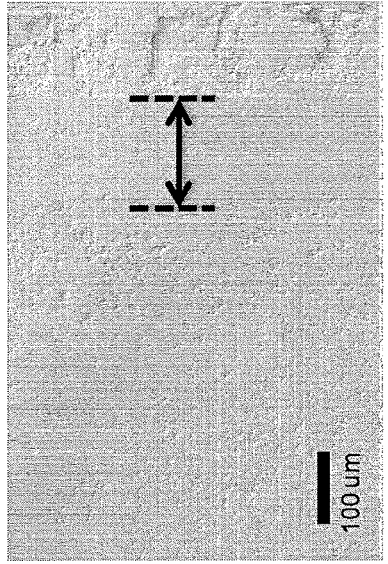
FIG. 11D shows a cross-section of a solid oxide membrane that has a degradation layer after being exposed to a flux with 5% $YF_3$ content.
Figure 11A:
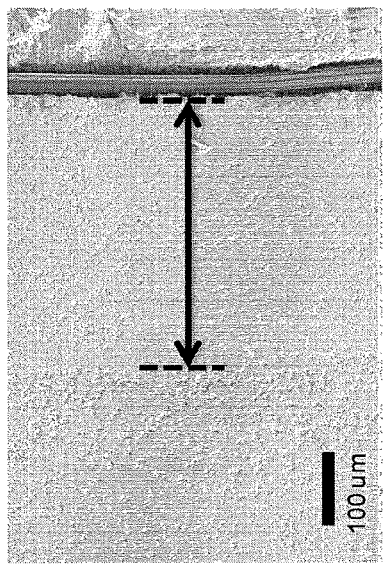
FIG. 11A shows a cross-section of a solid oxide membrane that has a degradation layer after being exposed to a flux with 0% $YF_3$ content.
Figure 11C:
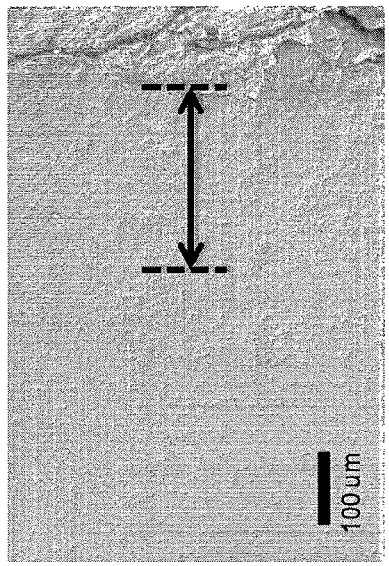
FIG. 11C shows a cross-section of a solid oxide membrane that has a degradation layer after being exposed to a flux with 3% $YF_3$ content.

FIGS. 11A, 11B, 11C, and 11D show that as the $YF_3$ content increases, the yttrium depletion layer thickness decreases. Specifically, FIGS. 11A-11D show a cross-section of a YSZ membrane after 10 hours of exposure to a fluxes of different $YF_3$ content. The respective percentage of $YF_3$ in each flux was 0% (FIG. 11A), 1.5% (FIG. 11B), 3% (FIG. 11C), and 5% (FIG. 11D). As the depletion layer gets thinner, fewer cracks were observed. Similar effects are expected with other zirconia stabilizers such as CaO, MgO, etc. For other stabilizers one would need to similarly add the respective fluorides of the stabilizer cations in the flux.

Figure 12:
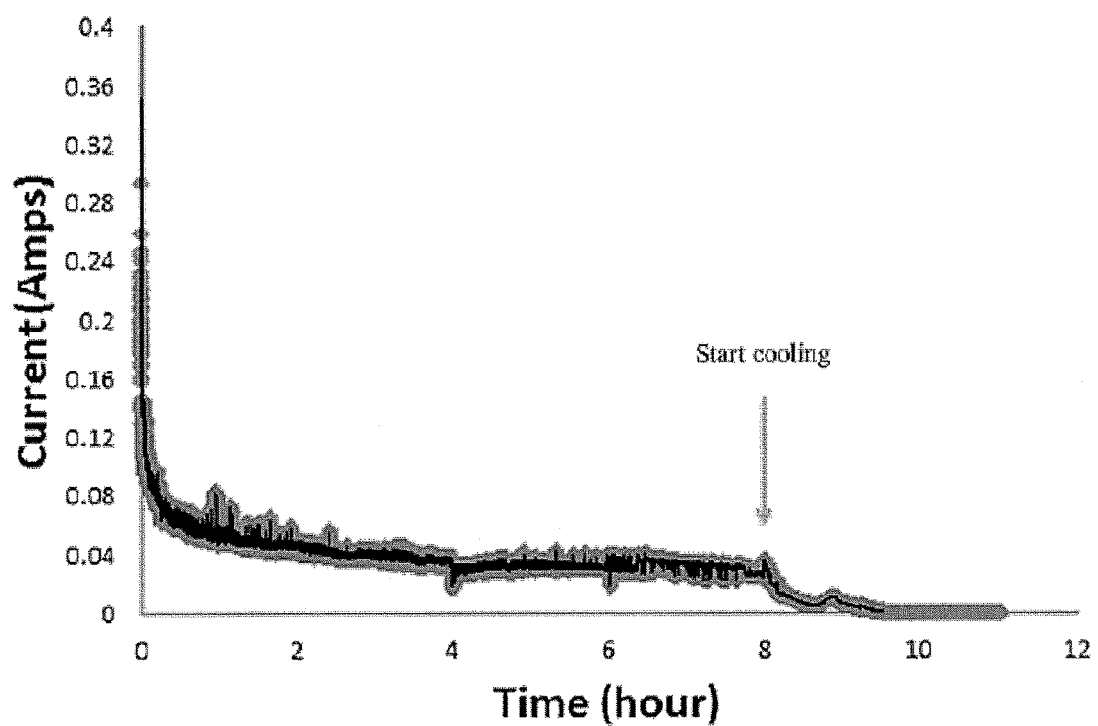
FIG. 12 shows a graph from a potentiostatic electrolysis of a SOM process according to an embodiment of the current invention.

Using an experimental setup similar to the schematic shown in FIG. 1, the applied electric potential between the cathode (liquid tin with tungsten current collector) and the anode (liquid tin with Mo current collector) was increased at 5 mV/s and the dissociation potential was observed at 0.84 V when hydrogen bubbled through the anode. The dissociation potential is indicated by the change in slope of the line shown in FIG. 6, for example. The dissociation potential is not limited to the one of this example and may vary. Dissociation has been observed at potentials below 0.84 V, including 0.83 V, for example. In addition, the potentiostatic electrolysis can be performed at a potential above the minimum dissociation potential. As shown in FIG. 12, an 8-hour potentiostatic electrolysis performed at 1.05 V before cooling began was used to produce silicon. The process is not limited to these parameters, however, and different times and potentials can be used. In another example, electrolysis was performed at 1.25 VB for 5.5 hours. Electrolysis at potentials above approximately 0.84 V reduces the silicon at the cathode:

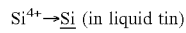
$Si^{4+}$→Si (in liquid tin)

The quantity of tin was sufficient to dissolve all the silicon reduced at the tin cathode. After electrolysis, when the system is slowly cooled Si crystals precipitates out.

Extraction of silicon from tin was achieved by wet-chemical etching. The tin/silicon mixture was immersed in environmental grade hydrochloride acid and the sample was allowed to stand overnight in a chemical hood. Hydrogen bubbling was observed during this process as predicted in the equation:

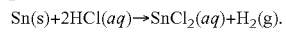
$Sn(s)+2HCl(aq)→SnCl_2(aq)+H_2(g)$.

The etching of the tin was complete when no more hydrogen evolved. The etched materials were then rinsed with water and filtered using standard gravity filtration methods. The filtered solid was air-dried and analyzed without further treatment.

References for Example 2

[1] U. B. Pal, A. C. Powell, "The Use of Solid-oxide-membrane Technology for Electrometallurgy," Journal of the Minerals, Metals and Materials Society, 59 (5) (2007), 44-49.

[2] A. Krishnan, Solid Oxide Membrane Process for the Direct Reduction of Magnesium from Magnesium Oxide, (Ph.D. Thesis), Boston University, 2005.

[3] U. B. Pal, "A Lower Carbon Foot Print Process for Production of Metals from their Oxide Sources," *JOM*, 60(2):36, 2008.

[4] E. Gratz, Solid Oxide Membrane (SOM) Stability in Molten Ionic Flux, (PhD Thesis) Boston University.

[5] M. Z. Jacobson, Review of solutions to global warming, air pollution and energy security, Energy and Enviromental Science, 2 (2009), pp. 148-173

[6] Polysilicon: Supply, Demand and Implications for the PV Industry 2008, Greentech Media/Prometheus Institute.

[7] L. C. Rogers, Handbook of Semiconductor Silicon Technology, W. C. O'Mara, R. B. Herring and L. P. Hunt, eds., Noyes Publications, New Jersey, 1990.

[8] Uday B. Pal, Adam C. Powell, "The Use of Solid-oxide-membrane Technology for Electrometallurgy," Journal of the Minerals, Metals and Materials Society, 59 (5) (2007), 44-49.

Example 3

Stability of the SOM membrane can contribute to high efficiency and long-term performance of the Si—SOM process. Discussed in this Example is a failure model of the SOM membrane by the formation of "inner cracks" attributed to yttrium depletion in the YSZ, which leads to phase transformation from the cubic to tetragonal phase. A series of systematic experiments were designed and performed to understand the synergistic roles of silica and $YF_3$ in the flux in membrane degradation. It was shown that silica attacks the SOM membrane, while $YF_3$ in the flux retards the attack. A detailed mechanism of the yttria depleted layer (YDL) formation, and its role in the formation of inner cracks is discussed below. Based on the study of this example, a new flux composition was designed and tested. The flux composition did not attack the SOM membrane, and Si crystals were produced at the liquid Sn cathode, thereby demonstrated longer-term viability of the Si—SOM process.

The SOM process designed to produce solar-grade silicon directly from silica ($SiO_2$), also referred to as "Si—SOM," and uses the SOM electrolysis apparatus 100 of FIG. 1. In the Si—SOM process of this example, the flux (referred to interchangeably as "ionic melt" or "molten salt") is composed of a eutectic composition of $BaF_2$ and $MgF_2$, which is molten at the operation temperature of around 1070° C. Silica ($SiO_2$) along with $YF_3$ is dissolved into the flux at elevated temperature, where they are separated into ionic components. The silicon cations are reduced at the cathode by the supply of electrons, while oxygen anions diffuse through the solid oxide conducting membrane (referred to interchangeably as "SOM tube") to the anode, where they are oxidized by losing their electrons and converted to pure oxygen gas. A tungsten (W) rod covered by a YSZ tube sleeve is used as the cathode, which was immersed in tin (Sn) contained by a small zirconia crucible. In order to avoid contamination, another YSZ tube is employed as a stirring tube by bubbling forming gas (5% $H_2$-95% Ar) through the molten flux. In the SOM experiment, pure hydrogen gas was passed through a molybdenum (Mo) tube at the anode side, so a low $pO_2$ could be established by reacting hydrogen with the oxygen ions migrating through the YSZ membrane. The low $pO_2$ inside the YSZ membrane not only prevented oxidation of the Sn anode, but also facilitated the diffusion of oxygen ions through the membrane by creating a driving force due to the $pO_2$ difference.

Figure 13A:
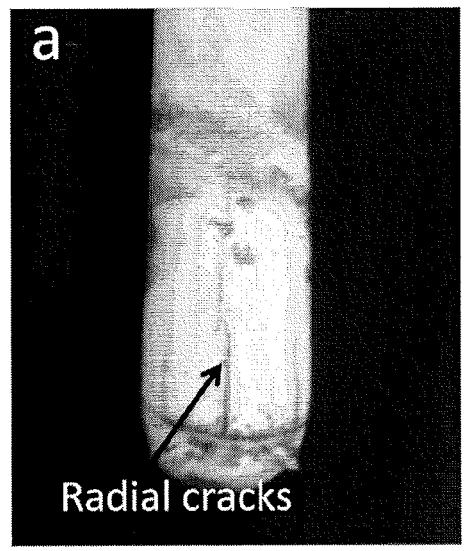
FIG. 13A shows a photograph of radial cracks formed in a SOM tube after performing a SOM electrolysis process according to an embodiment of the current invention.
Figure 13B:
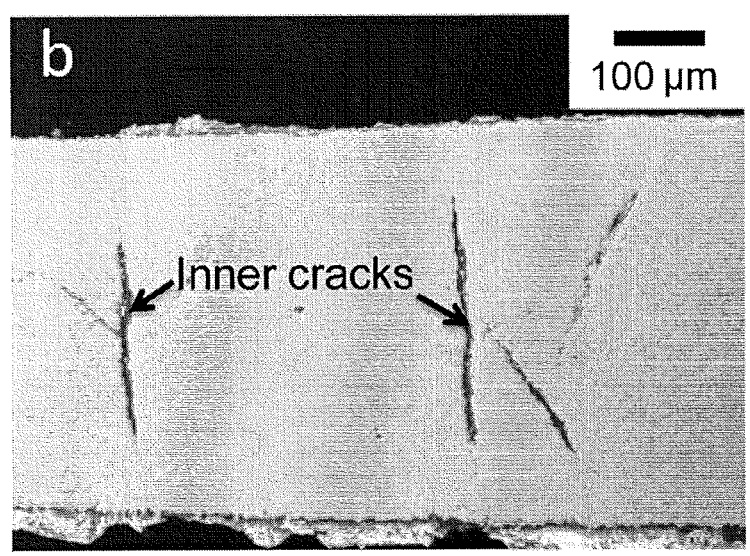
FIG. 13B shows an SEM image of a cross-section of a SOM tube showing internal cracks in the SOM tube according to an embodiment of the current invention.

Yttria-stabilized zirconia (YSZ) is used as the SOM membrane because of its oxygen ion conducting ability at elevated temperatures. The ability of the membrane to maintain its physical and chemical integrity is aids the viability of the Si—SOM electrolysis process. However, early Si—SOM experiments led to consistent cracking of the SOM tubes. FIG. 13A shows the presence of radial cracks that extended to the outside of the SOM tube. Usually, the radial crack did not reach the surface in contact with the flux. FIG. 13B shows an SEM micrograph of such radial cracks that do not reach the tube surface and are confined to the "bulk" of the membrane, and will hereon be referred to as "inner cracks." The formation of these inner cracks is consistent among multiple runs. This type of inner crack was previously unknown in the art.

The through-thickness cracks are highly undesirable since they will allow water vapor or oxygen gas to leak out and re-oxidizing the deposited metal, allow the flux to reach the anodic side, and initiate unwanted chemical reactions with the anode, and will allow the liquid Sn anode to leak out. Of course, even inner cracks are undesirable since they weaken the membrane, and will eventually lead to tube failure, and lead to high costs associated with replacing the expensive YSZ tubes.

In this example, the effect of $SiO_2$ and $YF_3$ content in the flux on membrane degradation was systematically studied. The concentration of these components (in wt %) for the various flux compositions used are listed in Table 1. The balance of all the fluxes used is a eutectic mixture of $MgF_2$ and $BaF_2$. The powders were placed in ceramic crucibles with lids and heated to 400° C. for six hours with a ramp rate of 3° C. per minute to remove any water content. After being dried, the powders were mixed into 100 g batches and then placed on a ball mill overnight for thorough mixing.

In order to answer the question whether the interaction between the flux and the SOM membrane is chemical, or electrochemical, the chemical stability tests with no applied potential were carried out. Sections of 6 mole % $Y_2O_3$—$ZrO_2$ (6YSZ) SOM tubes, open at both ends, were packed with the thoroughly mixed powders of different flux compositions into individual 304 stainless steel crucibles. The crucibles were slowly heated to 1100° C. in a forming gas (5% $H_2$-95% Ar) atmosphere, where the molten flux completely covered membrane samples, and held at temperature for 10 hours in the forming gas atmosphere. After the exposure, the system was slowly furnace cooled to room temperature, and the exposed membranes were sectioned in the middle, mounted in epoxy, and polished with diamond films down to 0.1 μm for microstructural analysis.

TABLE 1

$SiO_2$ and $YF_3$ compositions (in wt %) in the flux used in the stability study, with the balance being a eutectic $BaF_2$—$MgF_2$ mixture.

|  | 0% $SiO_2$ | 1% $SiO_2$ | 1.5% $SiO_2$ | 3% $SiO_2$ |
|---|---|---|---|---|
| 0% | 83.50% $BaF_2$ | 82.67% $BaF_2$ | 82.25% $BaF_2$ | 81.00% $BaF_2$ |
| $YF_3$ | 16.50% $MgF_2$ | 16.34% $MgF_2$ | 16.25% $MgF_2$ | 16.00% $MgF_2$ |
| 1.5% | 82.25% $BaF_2$ | 81.41% $BaF_2$ | 81.00% $BaF_2$ | 79.74% $BaF_2$ |
| $YF_3$ | 16.25% $MgF_2$ | 16.09% $MgF_2$ | 16.00% $MgF_2$ | 15.76% $MgF_2$ |
| 3% | 81.00% $BaF_2$ | 80.16% $BaF_2$ | 79.74% $BaF_2$ | 79.49% $BaF_2$ |
| $YF_3$ | 16.00% $MgF_2$ | 15.84% $MgF_2$ | 15.76% $MgF_2$ | 15.51% $MgF_2$ |
| 5% | 79.33% $BaF_2$ | 78.49% $BaF_2$ | 78.07% $BaF_2$ | 76.82% $BaF_2$ |
| $YF_3$ | 15.78% $MgF_2$ | 15.51% $MgF_2$ | 15.43% $MgF_2$ | 15.18% $MgF_2$ |
| 7.5% | 77.24% $BaF_2$ | 76.40% $BaF_2$ | 75.99% $BaF_2$ | 74.73% $BaF_2$ |
| $YF_3$ | 15.28% $MgF_2$ | 15.10% $MgF_2$ | 15.02% $MgF_2$ | 14.77% $MgF_2$ |
| 10% | 75.15% $BaF_2$ | 74.32% $BaF_2$ | 73.90% $BaF_2$ | 72.65% $BaF_2$ |
| $YF_3$ | 14.85% $MgF_2$ | 14.69% $MgF_2$ | 14.60% $MgF_2$ | 14.36% $MgF_2$ |

Scanning electron microscopy (SEM) and energy dispersive x-ray spectroscopy (EDS) microanalysis was performed using a Zeiss Supra 55VP (Carl Zeiss, Oberkochen, Germany) equipped with a Genesis energy-dispersive x-ray spectroscope (EDAX Inc., Mahwah, N.J.). In order to obtain smooth line profiles by avoiding grain boundaries and localized defects, the line profiles were obtained by taking average of 200 lines from spectrum maps. Two-dimensional (2D) X-ray diffraction (XRD) was performed with a Bruker D8 system equipped with a general area detector diffraction system (GADDS, Bruker AXS, Fitchburg, Wis.).

Figure 14A:
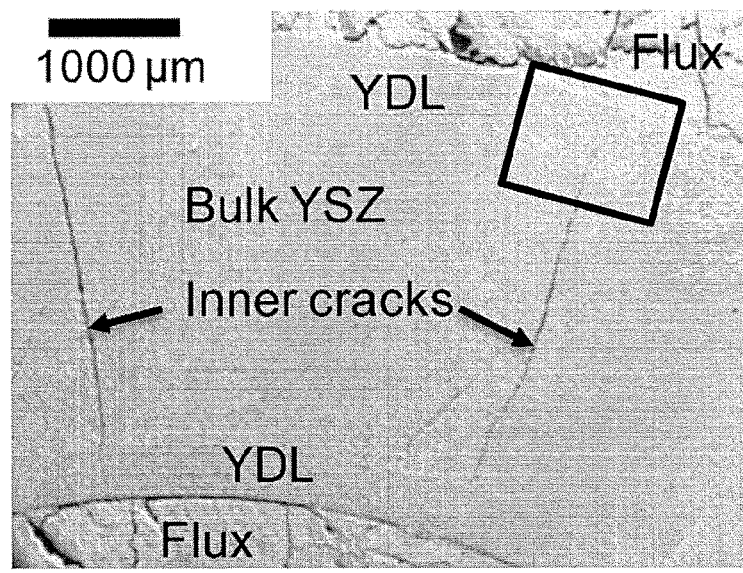
FIG. 14A shows a cross-section of a YSZ membrane, according to an embodiment of the current invention, with cracks shown in the bulk membrane after a stability test.
Figure 14B:
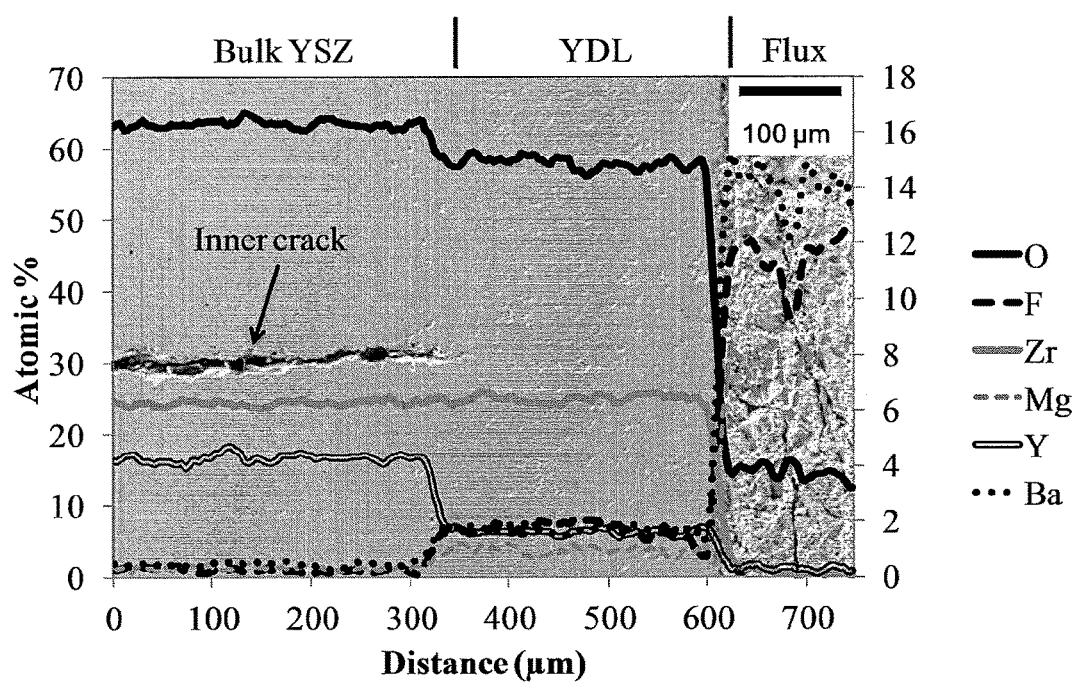
FIG. 14B shows the area within the rectangle in FIG. 12, with composition profile superimposed on the image along the cross-section.

FIG. 14A shows the cross-section of a sample after the stability test of high temperature exposure to the flux with no applied potential. Just as in the case of membranes used in the SOM process, radial inner cracks were observed in the 'bulk' region, indicating that the degradation mechanism leading to the formation of the inner cracks is a chemical process. This is in contrast with the observations of Martin et al. [8], who reported that in the absence of an applied potential, no membrane degradation was observed. As shown in FIG. 14A, a layer of fairly uniform thickness is present at the inner and outer edges of the membrane, and the layer exhibits a different contrast than the bulk of the membrane. On both sides, the inner cracks stop at the boundary of the bulk and this layer. FIG. 14B shows the interface between the bulk and this layer (marked by a rectangle in FIG. 14A) at a higher magnification. As shown in FIG. 14B, this surface layer appears to have significantly larger porosity than the bulk.

FIG. 14B also shows EDS line-scans of the elements of interest. As shown by the EDS line-scans, the Y and O signals drop together, somewhat sharply at the interface between the bulk YSZ and the porous surface layer, and then remain constant across the surface layer. This is an indication that there is a loss of yttria from this surface layer. Hence, the surface layer will hereon be referred to as the "yttrium depleted layer" (YDL). Also, the flux elements (F, Mg and Ba) appear to have entered the YDL with a relatively uniform composition across the layer. Furthermore, the relative ratios of flux elements (Mg:Ba:F) within YDL is consistent with the flux composition, which suggests that the liquid flux has physically penetrated into the YDL.

Figure 15:
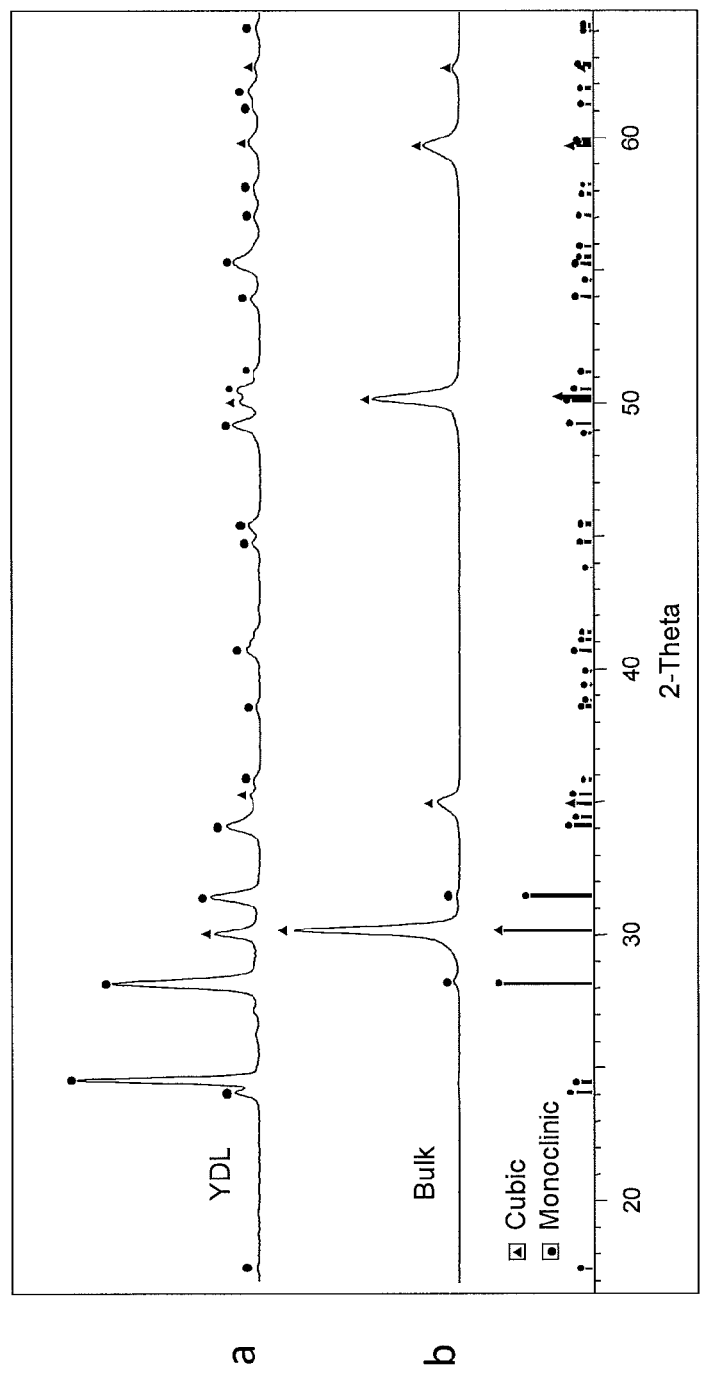
FIG. 15 shows graphs from an XRD scan of (a) a YDL region of a SOM tube and (b) a bulk region of a SOM tube, according to an embodiment of the current invention
Figure 16B:
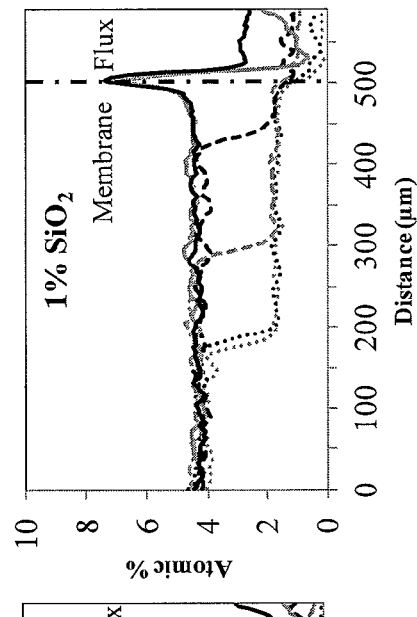
FIG. 16B shows yttrium line profiles across the membrane/flux interface with 1 wt % Si according to embodiments of the current invention.
Figure 16A:
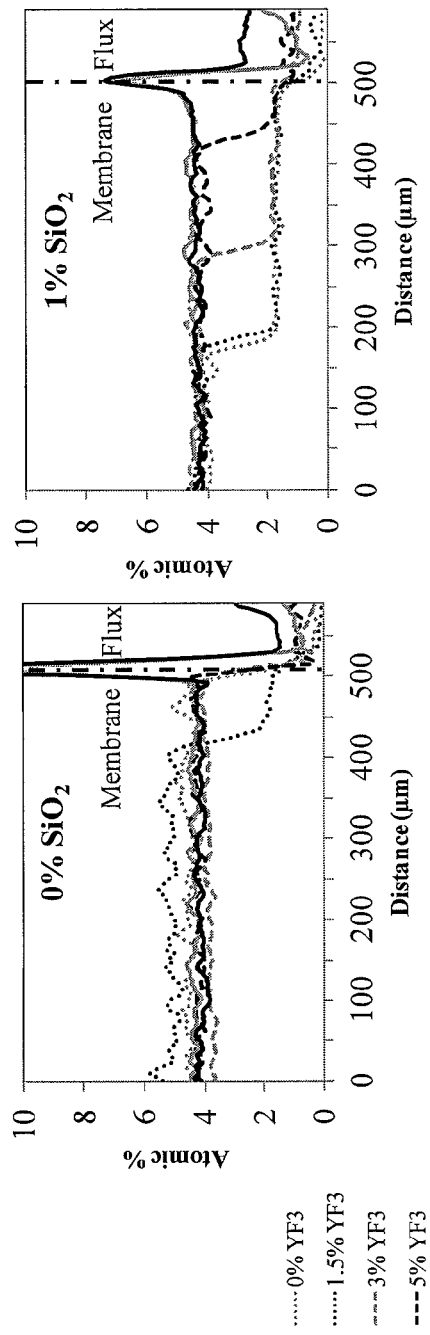
FIG. 16A shows yttrium line profiles across the membrane/flux interface with 0 wt % Si according to embodiments of the current invention.
Figure 16D:
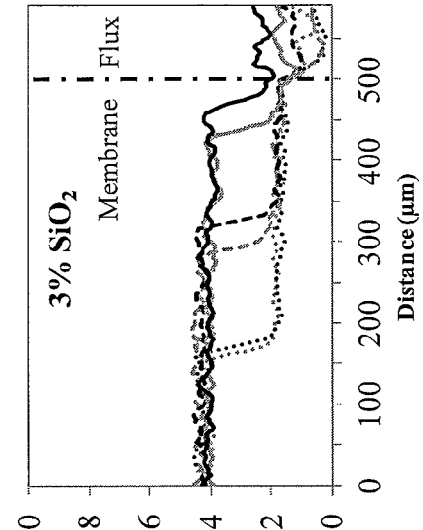
FIG. 16D shows yttrium line profiles across the membrane/flux interface with 3 wt % Si according to embodiments of the current invention.
Figure 16C:
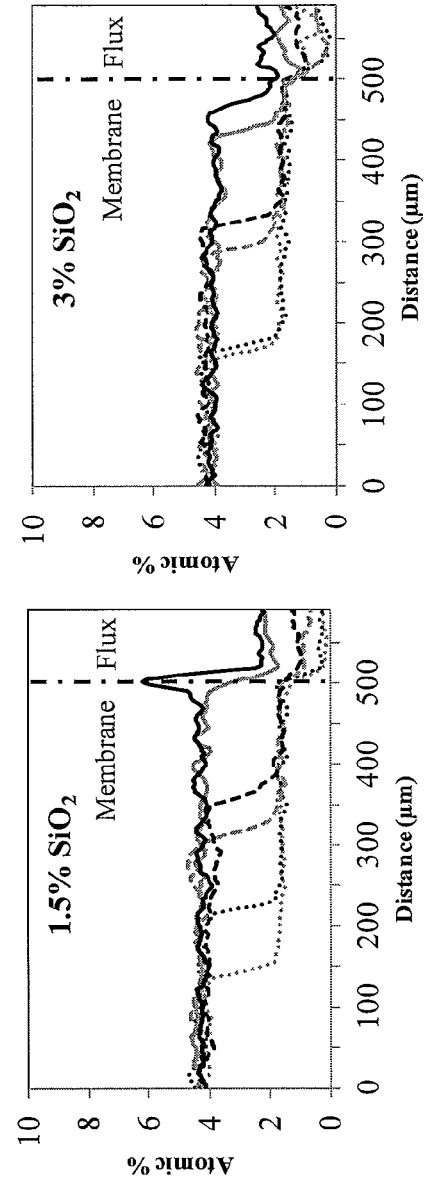
FIG. 16C shows yttrium line profiles across the membrane/flux interface with 1.5 wt % Si according to embodiments of the current invention.

FIG. 15 shows a high-resolution x-ray diffraction (XRD) analysis that was carried out using a 2-D detector to distinguish the phase differences between the YDL and the bulk regions of the membranes. A laser alignment system allows precise location of a small spot-size x-ray beam onto the two regions of the membrane. As shown in FIG. 15, there is significant monoclinic phase formation in the YDL region as compared to the bulk region.

FIGS. 16A, 16B, 16C, and 16D show only the Y concentration plotted across the YDL for all the samples because the formation of the YDL is related to a decrease in the Y concentration. For a given silica concentration in the flux (0 wt % in FIG. 16A, 1 wt % in FIG. 16B, 1.5 wt % in FIG. 16C, and 3 wt % in FIG. 16D), data for different $YF_3$ concentrations (0, 1.5, 3, 5, 7.5, and 10 wt %) are presented on the same plot.

From the data presented in FIGS. 16A-16D, three types of Y line-profile shapes can be discerned:

1. YDL formation with a step-drop in Y concentration at the bulk/YDL interface, consistent with FIG. 14B (0 wt % $SiO_2$ with 0 wt % $YF_3$, 1 wt % $SiO_2$ with 0-5 wt % $YF_3$, 1.5 wt % $SiO_2$ with 0-5 wt % $YF_3$, 3 wt % $SiO_2$ with 0-7.5 wt % $YF_3$).

2. No YDL formation with a flat Y profile across the entire membrane (0 wt % $SiO_2$ with 1.5-5 wt % $YF_3$, 1.5 wt % $SiO_2$ with 7.5 wt % $YF_3$, 3 wt % $SiO_2$ with 10 wt % $YF_3$).

3. No YDL formation with a Y spike in the membrane at the membrane/flux interface (0 wt % $SiO_2$ with 7.5-10 wt % $YF_3$, 1 wt % $SiO_2$ with 7.5-10 wt % $YF_3$, 1.5 wt % $SiO_2$ with 10 wt % $YF_3$).

Of these, inner crack formation was only associated with the first type profile, i.e. with YDL formation, and the inner cracks almost always stopped at the bulk/YDL interface. Thus, YDL formation is closely connected to the mechanical instability of the membranes, and understanding the mechanism of YDL formation is critical to implementing strategies that extend the life of the expensive SOM tubes. Hence, most of the discussion in this Example will be related to samples that fall in category 1 above. The formation of a Y concentration spike at the surface of the membrane in the third type of profile is associated with high $YF_3$ content in the flux. In this case, the Y has a higher chemical potential in the flux compared to the membrane, and Y migration occurs from the flux to the membrane driven by diffusion.

Figure 17A:
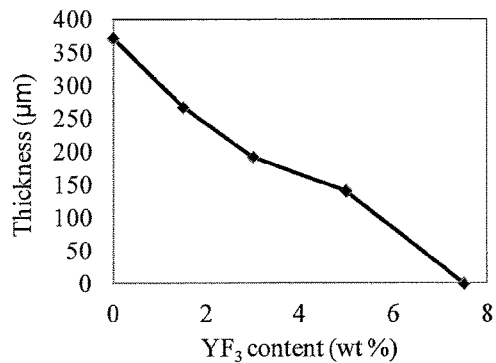
FIG. 17A shows a plot of the YDL thickness with varying $YF_3$ content according to embodiments of the current invention.
Figure 17B:
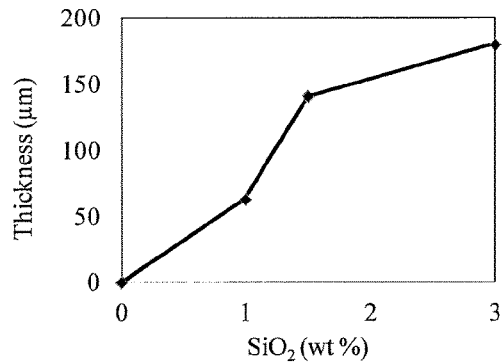
FIG. 17B shows a plot of the YDL thickness with varying $SiO_2$ content according to embodiments of the current invention.

As evident from FIGS. 16A-16D, for a fixed $YF_3$ concentration in the flux, addition of silica enhances YDL formation, while at a fixed silica concentration in the flux, addition of $YF_3$ retards YDL formation. This trend is highlighted in FIGS. 17A and 17B, which shows the effect of $YF_3$ concentration on samples exposed to flux with 1.5 wt % Si, and the effect of silica concentration on samples exposed to flux with 5 wt % $YF_3$. The existence of YDL for the 0 wt % $SiO_2$ with 0% $YF_3$ case seems to suggest that the membrane attack can occur even without the presence of $SiO_2$. However, small amounts of silica (0.15 wt %) impurities exist in YSZ, and may be responsible for the chemical attack. Addition of even small amount of $YF_3$ in the flux completely eliminates the YDL for the 0 wt % $SiO_2$ case.

In all of the cases explored in this Example, where YDL formation occurs, the Y concentration is not only fairly uniform in the YDL layer, but this value is never zero, but rather a constant value of ~2 at % in all cases with YDL formation.

Figure 18:
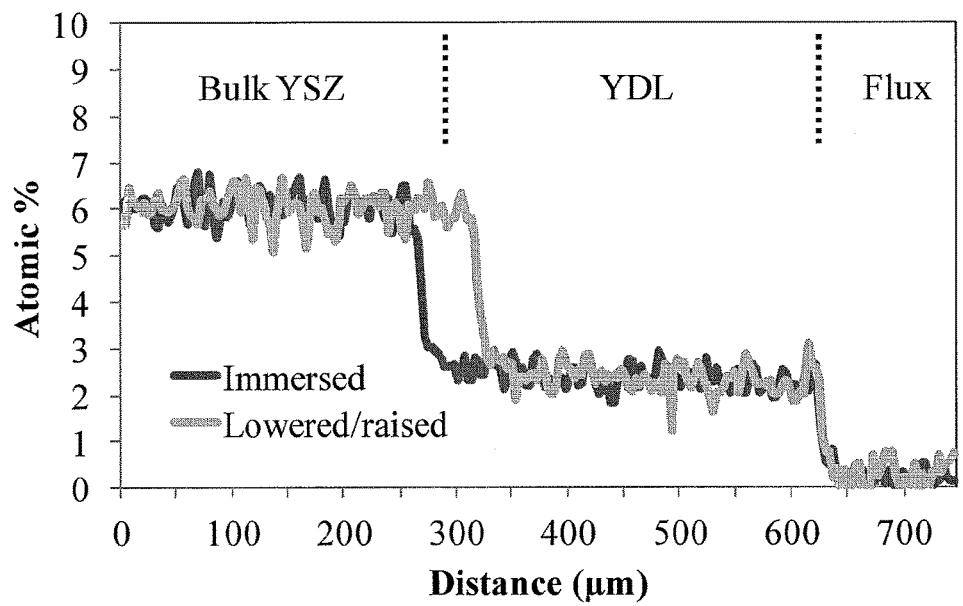
FIG. 18 shows the yttrium line profiles of two samples exposed to 0 wt % $YF_3$ and 1.5 wt % $SiO_2$ flux according to embodiments of the current invention.

One concern about the crack formation was whether stresses associated with the cooling of the sample that was constrained by the flux once it solidified, played any role in the formation of the inner cracks. To understand this effect, two identical samples were exposed, with one immersed in the flux during heat-up and cool-down, and the other lowered into the flux at target temperature and raised before cool-down. The Y depletion profile of the two samples is shown in FIG. 18. In both cases, inner cracks stopped at the YDL/bulk interface. This shows that the inner crack formation is associated with the formation of YDL, rather than heat-up and cool-down stresses due to CTE mismatch with the flux. The difference in the thickness of the YDL can be attributed to the more extended effective exposure time of the immersed since it always stayed in contact with the flux during the heat-up and cool-down.

Figure 19:
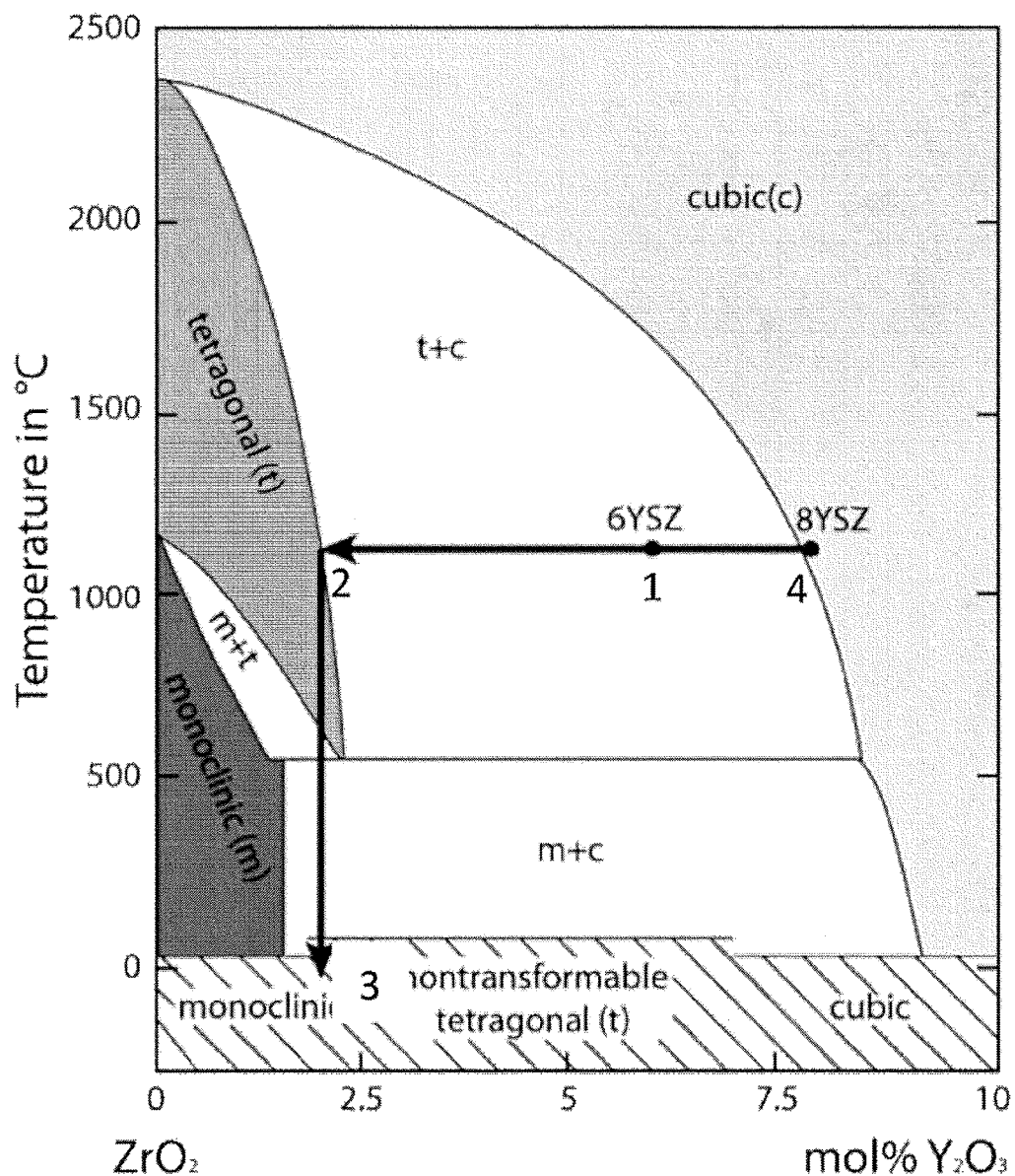
FIG. 19 shows a $ZrO_2$-$Y_2O_3$ phase diagram and proposed path of yttria depletion in YSZ for a Si—SOM process according to an embodiment of the current invention.

The formation of YDL region, where the remaining Y concentration reaches a fixed non-zero value suggests that the YDL composition is pinned at one end of a two-phase field. FIG. 19 shows the $ZrO_2$—$Y_2O_3$ phase diagram. Pure zirconia undergoes a transformation from the tetragonal (t) to monoclinic (m) phase on cooling below ~1150° C. This is accompanied by a well-known volume increase. Addition of "stabilizers" like yttria leads to a cubic (c) phase that does not undergo transformation on cooling. The cubic phase stabilizes the t phase at lower temperatures, remains in a metastable form even at temperatures below 500° C. Thus, this two-phase region is referred to as the "non-transformable" tetragonal (t') phase as noted on the phase diagram of FIG. 19.

The 6YSZ composition at 1100° C. is marked as point 1 in FIG. 19. The loss of yttria in samples forming a YDL moves the composition to the left, as shown by the arrow in FIG. 19. It is conjectured that in all cases, the yttria concentration drop stops at point 2 at the phase boundary between the t and c+t regions. In FIG. 19, that corresponds to a yttria reduction from 6 at % (point 1) to 2 at % (point 2), equivalent to yttrium concentration reduction from 3.8 at % to 1.8 at % (see Table 2), a 66% decrease. To compare with measured values in our study, the yttrium concentrations in the bulk and YDL are 4.25 at % and 1.61 at % respectively. The Y concentration differences between the expected and measured values are not surprising, since oxygen quantification by EDX is known to be not accurate. However, the measured relative drop in the Y concentration corresponds to a decrease of 62%, which is quite close to the theoretical value of 66%. On cooling the 2YSZ composition, the t→m transformation will occur (point 2 to point 3 in FIG. 19), consistent with the XRD results shown in FIG. 15.

TABLE 2

Atomic percent of O/Y/Zr of 6YSZ and 2YSZ.

|  | 6YSZ (Point 1 in FIG. 19) | 2YSZ (Point 2 in FIG. 19) |
| --- | --- | --- |
| O at % | 66.0% | 66.4% |
| Y at % | 3.8% | 1.3% |
| Zr at % | 30.1% | 32.2% |

Figure 20B:
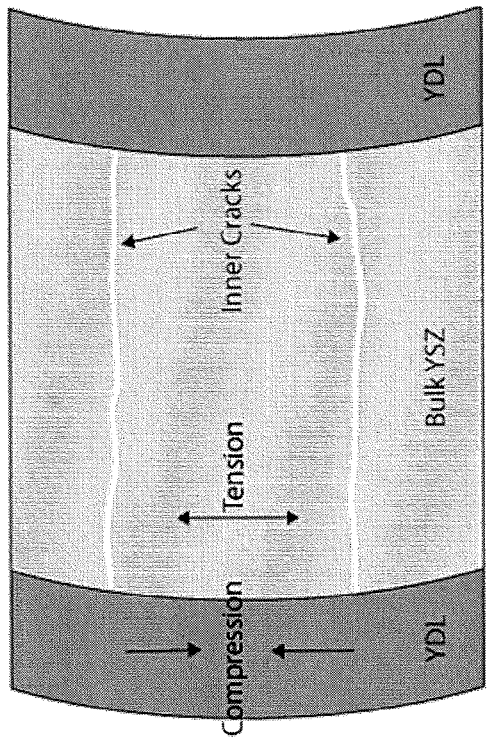
FIG. 20B shows a schematic of the structure shown in FIG. 20A, according to an embodiment of the current invention.
Figure 20A:
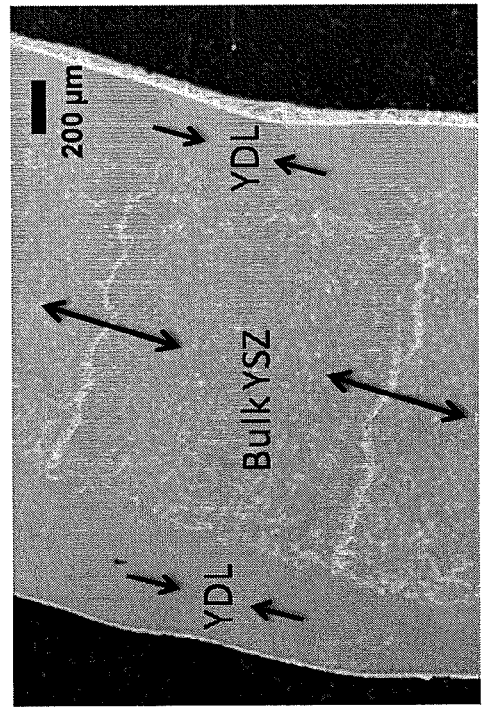
FIG. 20A shows an image of bulk YSZ, YDL, and cracks formed in the bulk YSZ, with arrows indicating compression and tension, according to an embodiment of the current invention.

The results of this Example validates that the yttria depletion from cubic phase is significantly faster than from the tetragonal phase. The formation of inner cracks can then be tied to the YDL. On cooling, t→m phase transformation occurs within the YDL. As indicated in FIGS. 20A and 20B, the transformed YDL wants to expand due to the volume expansion accompanied by this transformation, but is held back by the bulk YSZ, putting the YDL in a state of compressive stresses. Force balance dictates that the bulk must then be under tension. These tensile stresses in the bulk are responsible for the radial inner cracks, as shown in FIGS. 20A and 20B.

FIGS. 16A-16D show that silica attributes to membrane degradation. At SOM operating temperatures, the Gibbs free energy of yttria is significantly lower than silica, implying that oxygen anions attract yttrium cations more than silicon cations in the flux. Thus, addition of $YF_3$ in the flux reduces the propensity for silica-YSZ interactions. This is consistent with results of this Example that increasing silica content of the flux increases YDL formation while increasing $YF_3$ in the flux retards YDL formation.

Figures 21A, 21B, 21C:
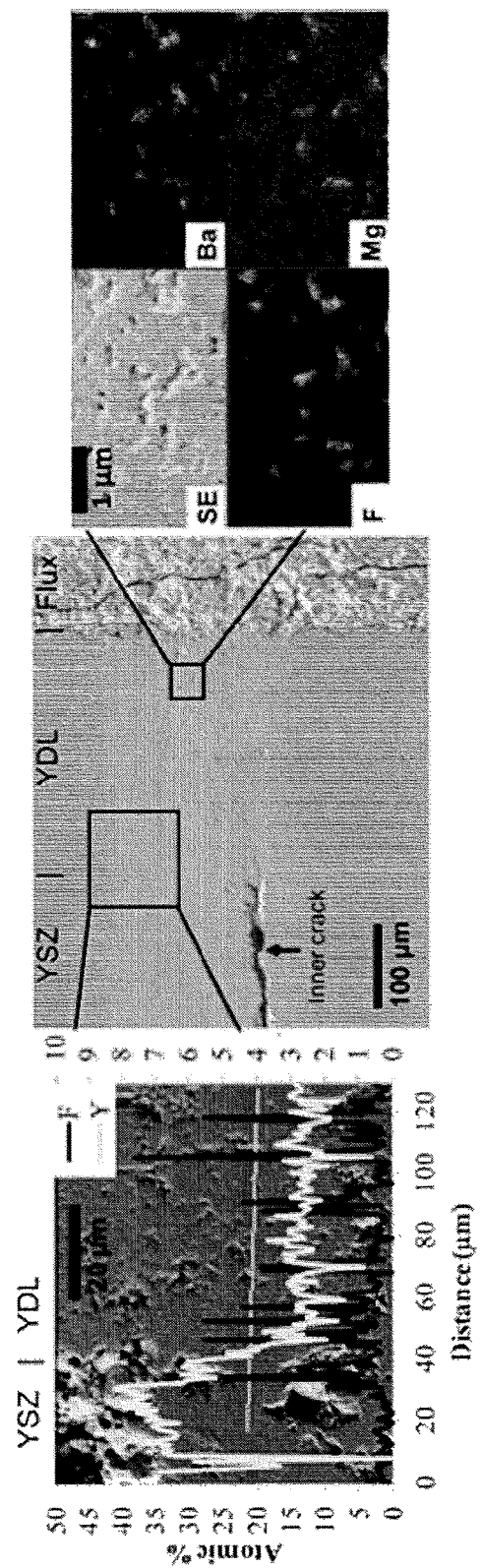
FIG. 21A shows an SEM micrograph of YDL region of a degraded membrane according to an embodiment of the current invention.
FIG. 21B shows a higher magnification micrograph of the interface between bulk YSZ and YDL, overlaid with Y and F line profiles, according to an embodiment of the current invention.
FIG. 21C shows a higher magnification of the YDL with elemental maps of F, Ba and Mg according to an embodiment of the current invention.

A more detailed observation of the YDL leads to an understanding of the degradation mechanism. FIG. 21A shows an SEM micrograph of YDL region of a degraded membrane. FIG. 21B shows the bulk YSZ/YDL interface at a higher magnification with overlaid shows F and Y line scan profiles. The line scan shows that the F spikes coincide with the Y concentration dips. These locations correspond to grain boundaries or triple junctions, where flux has penetrated into the YDL. The regions between the concentration spikes/dips are grains, where the Y concentration is uniform. This yttrium uniformity reinforces the fact that in the YDL, the grains are losing Y uniformly, while the flux has penetrated the grain boundaries and triple junctions. This is further reinforced by FIG. 21C, where dot-maps of F, Ba, and Mg, indicate flux penetration into the YDL, and accumulation mainly in the triple phase boundaries.

Figure 22:
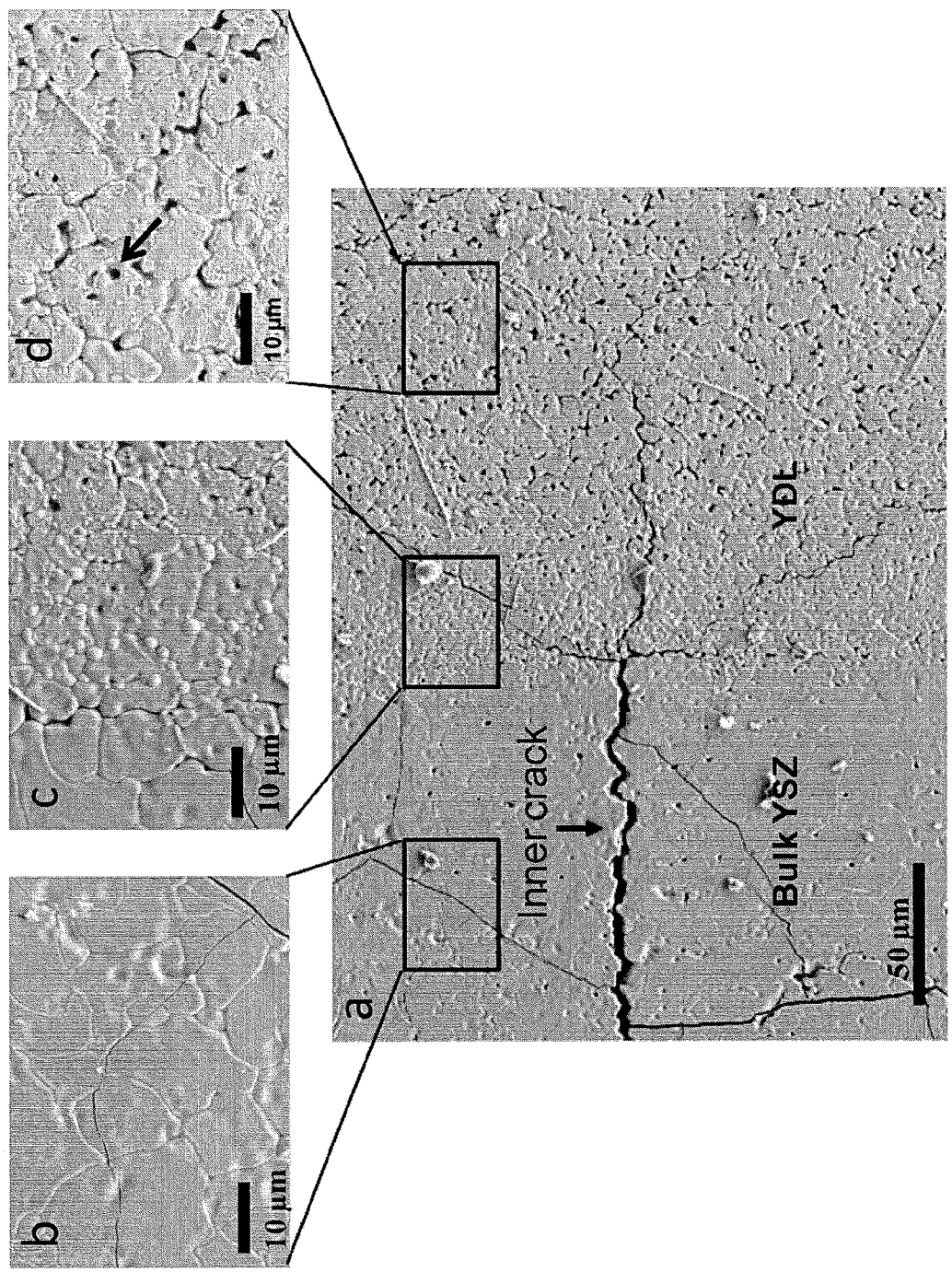
FIG. 22 shows a cross-section SEM micrograph of thermally etched membrane at the YSZ/YDL interface region, according to an embodiment of the current invention, with magnified views of portions shown in inserts.

In order to better visualize the grain boundaries, a sample was thermally etched for 1 hour at 1500° C. As shown in FIG. 22, the grain boundaries are now clearly visible. Although there is considerable porosity in the YDL, the grain size in both the bulk and YDL regions appear unchanged (magnified view c). Magnified view d in FIG. 22 shows that the grain boundaries in the YDL are clearly attacked; with flux vaporization during the thermal etch leaving the pores, mainly located at the grain boundaries and triple junctions, open. Interestingly, there are some voids present within the grains of the YDL (one is marked by arrow), which are not present in the bulk YSZ (magnified view b in FIG. 22).

The step drop in the Y concentration and its uniformity across the YDL suggest that the kinetics of YDL formation is not controlled by Y diffusion, but rather by the rate at which silica attacks the grain boundaries of the YSZ. In order to understand the kinetics of YDL formation, four samples were exposed to the same flux (1 wt % $SiO_2$ with 0 wt % $YF_3$) for different times, ranging from 10 to 25 hours.

The results are plotted in FIG. 23, which shows the YDL thickness grows linearly with time, confirming that YDL formation is not a diffusion-limited process. However, the linear fit does not intercept the origin indicating faster kinetics at the early stages of the degradation. This can be explained by the mechanism of degradation detailed below.

The schematic of the YDL formation mechanism is shown in FIGS. 24A, 24B, 24C, and 24D. This is generally for the cases in which the Y-activity in the YSZ is higher than the Y-activity in the flux, leading to a driving force for the migration of Y from the cubic YSZ grains to the flux. FIG. 24A shows the starting YSZ bordering the flux before being degraded by exposure to the flux at an elevated temperature. FIGS. 24B, 24C, and 24D show successive stages of membrane degradation including an advancing gain boundary attack and the formation of voids and pores in the YDL, respectively. For convenience, the starting YSZ is assumed to be all cubic phase (grey, corresponding to 8YSZ: point 4 in FIG. 19), which has higher yttria content than tetragonal phase (white, corresponding to 2YSZ: point 2 in FIG. 19). During the early stages of the degradation shown in FIG. 24B, yttrium diffuse out from the cubic YSZ grains to the flux. This initial rate of Y depletion from these outermost grains of YSZ is relatively rapid since the entire surface of these YSZ grains is directly exposed to the flux. This Y depletion converts the cubic grains to tetragonal (shown by a change from grey to white in FIG. 24B). Meanwhile, the silica in the flux attacks the grain boundaries of the YSZ. This attacked region allows for easy grain penetration of the flux, which equilibrates the chemical potential of Y at the YDL grain boundaries with the bulk liquid flux, as shown in FIG. 24C. This leads to a driving force for the Y to diffuse out of the bulk of cubic YSZ grains to the flux at the grain boundaries converting the cubic YSZ grains to tetragonal YSZ, and the excess Y is carried out to the bulk of the molten flux. The linear rate of YDL formation, indicated in FIG. 23, suggests that the diffusion of Y from a cubic YSZ grain to the flux surrounding its grain boundary, and the removal of the excess Y to the bulk of the flux is rapid as compared to the rate at which the silica in the flux attacks the YSZ grain boundaries. Thus, the rate of YDL formation is determined by the rate at which silica in the flux attacks the YSZ grain boundaries, which leads to linear degradation kinetics. The rate of grain boundary attack by silica increases with silica content in the flux and decreases with $YF_3$ content in the flux. As a result the regions around attacked grain boundaries underwent destabilization and convert to t-YSZ. When all the cubic grains are converted to tetragonal, the region becomes the observed YDL. The slower mobility in the tetragonal phase effectively stops (or slows down significantly) further diffusion of Y out of the grains. It is conjectured that the pores within the grains of converted tetragonal phase (FIG. 24D) is due to the loss of yttria and subsequent vacancy coalescence.

Figure 25:
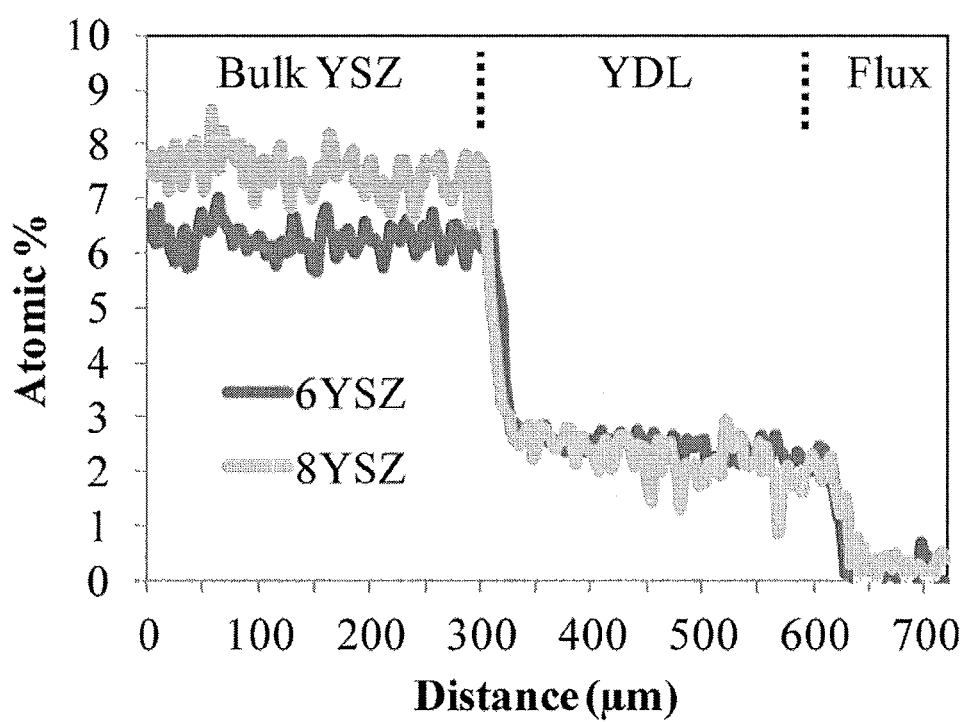
FIG. 25 shows yttria line profiles of a 6YSZ sample and a 8YSZ sample after identical flux exposure according to an embodiment of the current invention.

A stability test was performed where the standard 6YSZ sample was compared to a fully cubic 8YSZ membrane under identical flux exposure conditions. The results, presented in FIG. 25, shows that the YDL thickness for both samples is the same. This reinforces the fact that the rate controlling step is the grain boundary attack by the silica, and out-diffusion of Y from the bulk of a cubic YSZ grain to the surrounding flux at the grain boundary is relatively faster, thus making the initial concentration of cubic grains in the YSZ irrelevant to the degradation kinetics.

Apart from mechanical degradation by inner crack formation, yttria loss from YSZ also reduces the concentration of oxygen vacancies, and will degrade the performance of the Si—SOM run by reducing the oxygen ion conductivity of the membrane. Thus, it is important that Y diffusion of the membrane and subsequent YDL formation be avoided. The study of this Example suggests that fluxes with lower silica content and higher $YF_3$ content are beneficial for membrane stability. Of course, lowering the silica content too much could make the availability of Si ions in the melt as the rate controlling process for solar grade Si formation.

Figure 26B:
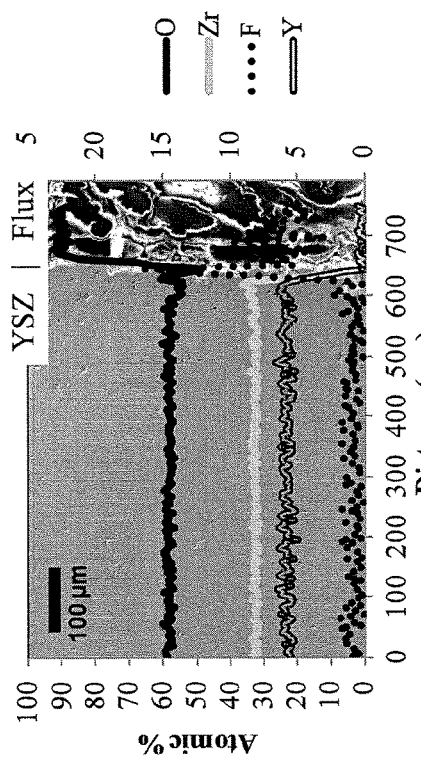
FIG. 26B shows an SEM image at 150× of the cross section of the YSZ membrane with overlays of EDS line profiles of O, Zr, F, and Y according to an embodiment of the current invention.
Figure 26C:
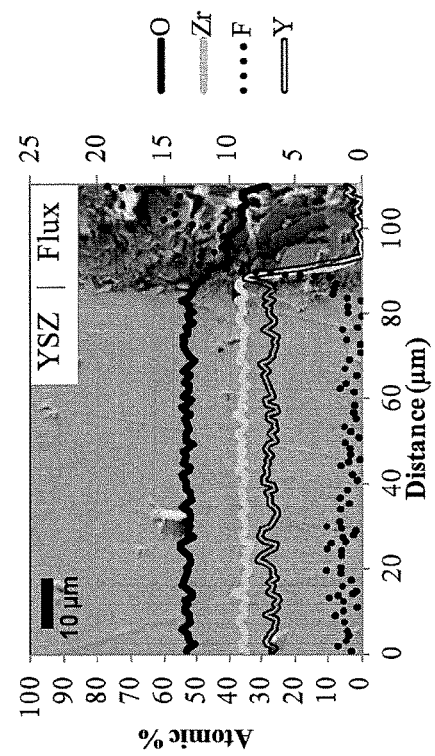
FIG. 26C shows an SEM image at 1000× of the cross section of the YSZ membrane with overlays of EDS line profiles of O, Zr, F, and Y according to an embodiment of the current invention.
Figure 26A:
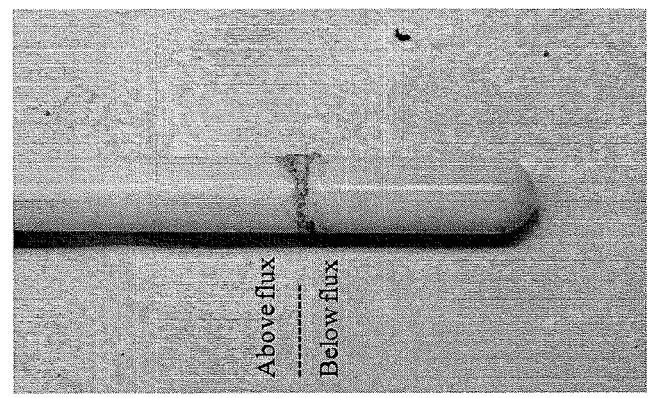
FIG. 26A shows a photo of a YSZ membrane after a 27 hour Si—SOM run according to an embodiment of the invention.

Keeping these constraints in mind, a 2 wt % Si with 15 wt % $YF_3$ flux was chosen for the Si—SOM experiment. The higher $YF_3$ content was chosen to provide a safety factor to account for the unknown effects of applying a potential, which was not present in the stability studies. FIG. 26A shows the SOM tube after the successful run. No cracks are visible. FIGS. 26B and 26C show the cross section of the tube where the outer edge is in contact with the flux. The line profiles show no Y depletion or formation of a porous YDL. This implies that the chosen flux is suitable for long term operation of the Si—SOM process. In this study, the Si was formed at the extended Sn cathode, and on cooling, the crystals precipitates out at the Sn/flux interface.

References for Example 3

[1] U. B. Pal, D. E. Woolley, and G. B. Kenney, "Emerging SOM technology for the green synthesis of metals from oxides," *Jom*, vol. 53, no. 10, pp. 32-35, October 2001.

[2] U. Pal, "The use of solid-oxide-membrane technology for electrometallurgy," *JOM Journal of the Minerals, Metals and Materials*, vol. 59, no. May, pp. 44-49, 2007.

[3] A. Krishnan and U. Pal, "Solid oxide membrane process for magnesium production directly from magnesium oxide," *Metallurgical and Materials Transactions B*, vol. 36, no. August, 2005.

[4] A. Krishnan and X. Lu, "Solid Oxide Membrane (SOM) technology for environmentally sound production of tantalum metal and alloys from their oxide sources," *Scandinavian journal of*, vol. 34, no. 5, pp. 293-301, 2005.

[5] M. Suput, "Solid oxide membrane technology for environmentally sound production of titanium," *Mineral Processing and Extractive Metallurgy*, vol. 117, no. 2, pp. 118-122, 2008.

[6] Y. Jiang and P. Zink, "Solid Oxide Membrane Process for the Reduction of Uranium Oxide Surrogate in Spent Nuclear Fuel," *ECS Transactions*, vol. 41, no. 33, pp. 171-180, 2012.

[7] Y. Jiang, J. Xu, X. Guan, U. B. Pal, and S. N. Basu, "Production of Silicon by Solid Oxide Membrane-Based Electrolysis Process," *MRS Proceedings*, vol. 1493, pp. MRSF12-1493-E19-89, January 2013.

[8] A. Martin, J. C. Poignet, J. Fouletier, M. Allibert, D. Lambertin, and G. Bourgès, "Yttria-stabilized zirconia as membrane material for electrolytic deoxidation of CaO—CaCl2 melts," *Journal of Applied Electrochemistry*, vol. 40, no. 3, pp. 533-542, October 2010.

[9] E. Gratz, J. Milshtein, and P. Uday, "Determining Yttria Stabilized Zirconia (YSZ) Stability in Molten Oxy-Fluoride Flux for the Production of Magnesium with the SOM Process," *Journal of the American Ceramic Society* (In press).

[10] McDanel Advanced Ceramics, "Zirconia Physical Properties," http://www.mcdanelceramics.com/pdf/mcdanel_zirconia.pdf.

[11] N. Reddy and A. S. Gandhi, "Molten salt attack on t' yttria-stabilised zirconia by dissolution and precipitation," *Journal of the European Ceramic Society*, vol. 33, no. 10, pp. 1867-1874, September 2013.

[12] T. Mori, "Stability of Tetragonal Zirconia in Molten Fluoride Salts," *Journal of the Ceramic Society of Japan*, vol. 94, p. 961, 1986.

[13] C. J. Stournaras, A. Tsetsekou, T. Zambetakis, C. G. Kontoyannis, and G. Carountzos, "Corrosion of yttria-fully stabilized zirconias in molten fluorides," *Journal of Materials Science*, vol. 30, no. 17, pp. 4375-4379, September 1995.

[14] J. Milshtein, E. Gratz, S. Pati, A. C. Powell, and U. Pal, "Yttria stabilized zirconia membrane stability in molten fluoride fluxes for low-carbon magnesium production by the SOM process," *Journal of Mining and Metallurgy, Section B: Metallurgy*, vol. 49, no. 2, pp. 183-190.

[15] S. Badwal, "Yttria-zirconia: effect of microstructure on conductivity," *Journal of materials science*, vol. 22, pp. 3231-3239, 1987.

[16] S. P. S. Badwal and J. Drennan, "Grain boundary resistivity in Y-TZP materials as a function of thermal history," *Journal of Materials Science*, vol. 24, no. 1, pp. 88-96, January 1989.

[17] C. Appel and N. Bonanos, "Structural and electrical characterisation of silica-containing yttria-stabilised zirconia," *Journal of the European Ceramic Society*, vol. 19, pp. 847-851, 1999.

[18] Y.-S. Jung, J.-H. Lee, J. H. Lee, and D.-Y. Kim, "Liquid-phase redistribution during sintering of 8 mol % yttria-stabilized zirconia," *Journal of the European Ceramic Society*, vol. 23, no. 3, pp. 499-503, March 2003.

[19] J. L. Hertz, A. Rothschild, and H. L. Tuller, "Highly enhanced electrochemical performance of silicon-free platinum-yttria stabilized zirconia interfaces," *Journal of Electroceramics*, vol. 22, no. 4, pp. 428-435, April 2008.

[20] Y. Ikuhara, P. Thavorniti, and T. Sakuma, "Solute segregation at grain boundaries in superplastic SiO2-doped TZP," *Acta Materialia*, vol. 45, no. 12, pp. 5275-5284, December 1997.

[21] L. Gremillard, T. Epicier, J. Chevalier, and G. Fantozzi, "Microstructural study of silica-doped zirconia ceramics," *Acta Materialia*, vol. 48, no. 18-19, pp. 4647-4652, December 2000.

[22] S. Primdahl, "Microstructural examination of a superplastic yttria-stabilized zirconia: implications for the superplasticity mechanism," *Acta metallurgica et materialia*, vol. 43, no. 3, 1995.

[23] X. Chen, K. Khor, S. Chan, and L. Yu, "Overcoming the effect of contaminant in solid oxide fuel cell (SOFC) electrolyte: spark plasma sintering (SPS) of 0.5 wt. % silica-doped yttria-stabilized zirconia (YSZ)," *Materials Science and Engineering: A*, vol. 374, no. 1-2, pp. 64-71, June 2004.

[24] J. Šestak and P. Šimon, Thermal analysis of Micro, Nano- and Non-Crystalline Materials: Transformation, Crystallization, Kinetics and Thermodynamics. Springer, 2013, p. 484.

[25] A. H. Chokshi, "Diffusion, diffusion creep and grain growth characteristics of nanocrystalline and fine-grained monoclinic, tetragonal and cubic zirconia," *Scripta Materialia*, vol. 48, no. 6, pp. 791-796, March 2003.

[26] I. R. Gibson, G. P. Dransfield, and J. T. S. Irvine, "Influence of yttria concentration upon electrical properties and susceptibility to ageing of yttria-stabilised zirconias," *Journal of the European Ceramic Society*, vol. 18, no. 6, pp. 661-667, January 1998.

[27] C. C. Appel, N. Bonanos, A. Horsewell, and S. Linderoth, "Ageing behaviour of zirconia stabilised by yttria and manganese oxide," *Journal of Materials Science*, vol. 36, no. 18, pp. 4493-4501, September 2001.

[28] N. Q. Minh, "Ceramic Fuel Cells," *Journal of the American Ceramic Society*, vol. 76, no. 3, pp. 563-588, March 1993.
[29] C. C. Appel, N. Bonanos, A. Horsewell, and S. Linderoth, "Ageing behaviour of zirconia stabilised by yttria and manganese oxide," *Journal of Materials Science*, vol. 36, no. 18, pp. 4493-4501, 2001.
[30] Y. Jiang, J. P. Xu, B. Lo, U. B. Pal, and S. N. Basu, "Production of Silicon from Silica: Solid-Oxide-Membrane Based Electrolysis Process", EPD Congress 2013, DOI: 10.1002/9781118658468.ch20, 2013.

OTHER REFERENCES

[1] Kazuki Morita and Takeshi Yoshikawa, Thermodynamic evaluation of new metallurgical refining processes for SOG-silicon production, Transactions of Non-ferrous Metals Society of China, 21 (2011), 685-690
[2] K. Morita et al., Si Refining Technology" to be published in Metallurgical and Materials Transaction, 2013.

We claim:

1. A method of manufacturing silicon via a solid oxide membrane electrolysis process, comprising:
providing a first crucible defining a cavity;
providing a flux within said cavity of said first crucible, said flux comprising silicon oxide in solution;
providing a cathode disposed in said cavity of said first crucible in electrical contact with said flux, said cathode comprising a silicon-absorbing portion within a second crucible disposed inside said first crucible containing said flux, said silicon-absorbing portion being in fluid communication with said flux, said silicon-absorbing portion comprising a metal;
providing an anode disposed in said cavity of said first crucible and spaced apart from said cathode and being in electrical contact with said flux, said anode comprising a solid oxide membrane around at least a portion of said anode;
heating said flux and said silicon-absorbing portion to an operating temperature of said solid oxide membrane electrolysis process;
generating an electrical potential between said cathode and said anode sufficient to dissociate the silicon oxide and reduce silicon at said operating temperature of said solid oxide membrane electrolysis process, said operating temperature being sufficient to form a liquid solution of said silicon and said metal; and
cooling said silicon-absorbing portion to a precipitation temperature that is below said operating temperature and at which said silicon separates out of said silicon-absorbing portion and precipitates in solid form into said second crucible while the metal of the silicon-absorbing portion remains a liquid,
wherein said silicon-absorbing portion preferentially absorbs silicon relative to a remainder of said flux at said operating temperature, and said silicon-absorbing portion is a liquid at said operating temperature, and
wherein said solid oxide membrane is permeable to oxygen.

2. The method according to claim 1, further comprising stirring said flux with an inert-gas-bubbling tube.

3. The method according to claim 1, wherein said generating said electrical potential includes increasing said electrical potential at about 5 mV/s until said electrical potential reaches or exceeds the dissociation potential of silicon oxide.

4. The method according to claim 3, wherein said dissociation potential is at least 0.8 V.

5. The method according to claim 1, wherein said operating temperature is 800 to 1500 degrees Celsius.

6. The method according to claim 1, wherein said anode further comprises a liquid metal anode portion.

7. The method according to claim 1, wherein said silicon-absorbing portion has a lower melting temperature than silicon.

8. The method according to claim 1, wherein said cathode further comprises a current collector in contact with said silicon-absorbing portion.

9. The method according to claim 8, wherein said current collector comprises tungsten.

10. The method according to claim 1, wherein said solid oxide membrane comprises zirconium oxide.

11. The method according to claim 1, wherein said solid oxide membrane comprises cerium oxide.

12. The method according to claim 10, wherein said solid oxide membrane further comprises a stabilizing element, and
wherein said stabilizing element is at least one or more oxides of yttrium, calcium, scandium, and magnesium.

13. The method according to claim 1, wherein said flux further comprises an oxide of at least one of yttrium, calcium, barium, and magnesium.

14. The method according to claim 13, wherein said oxide is at least one of CaO, MgO, and $Y_2O_3$.

15. The method according to claim 1, wherein said silicon-absorbing portion has a higher density than said flux at said operating temperature.

16. The method according to claim 1, wherein said silicon-absorbing portion is selected from the group consisting of tin, aluminum, and bismuth.

17. The method according to claim 1, wherein, at said operating temperature, said flux has an ionic conductivity of at least 2 S/cm.

18. The method according to claim 1, wherein, at said operating temperature, said flux has an oxide solubility of at least 0.5 wt %.

19. The method according to claim 18, wherein said oxide solubility is about 1 to 10 wt %.

20. The method according to claim 1, wherein, at said operating temperature, said flux has a viscosity of less than 0.1 Pa·s.

21. The method according to claim 1, wherein, at said operating temperature, said flux has a volatility of less than $10^{-6}$ g/cm$^2$s.

22. The method according to claim 1, wherein, at said operating temperature, said flux is inert with respect to said solid oxide membrane.

23. The method according to claim 1, wherein said flux comprises halides having cations with a lower electronegativity than silicon.

24. The method according to claim 23, wherein said halides include at least one of magnesium, barium, calcium, and lithium.

25. The method according to claim 1, wherein said flux comprises 10-50 wt % $MgF_2$, 2-15 wt % $YF_3$, and 1 to 7 wt % $SiO_2$, with a balance of said flux comprising $BaF_2$.

26. The method according to claim 25, wherein said flux comprises 76.8 wt % $BaF_2$, 15.2 wt % $MgF_2$, 5 w % $YF_3$, and 3 wt % $SiO_2$.

27. The method according to claim 1, wherein said flux comprises 2 wt % $SiO_2$ and 15 wt % $YF_3$ added into an eutectic mix of magnesium fluoride-barium fluoride ($MgF_2$—$BaF_2$) powder comprising 16.5 wt % $MgF_2$ and 83.5 wt % $BaF_2$.

28. The method according to claim 1, wherein said operating temperature is 900 to 1500 degrees Celsius.

* * * * *